(12) United States Patent
Kim et al.

(10) Patent No.: US 12,075,640 B2
(45) Date of Patent: Aug. 27, 2024

(54) DISPLAY APPARATUS AND MASK FOR MANUFACTURING THE SAME

(71) Applicant: Samsung Display Co., Ltd., Yongin-si (KR)

(72) Inventors: Inho Kim, Yongin-si (KR); Juyeon Seo, Yongin-si (KR); Sungwoo Cho, Yongin-si (KR); Donghoon Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/520,255

(22) Filed: Jul. 23, 2019

(65) Prior Publication Data

US 2020/0127220 A1 Apr. 23, 2020

(30) Foreign Application Priority Data

Oct. 23, 2018 (KR) .......................... 10-2018-0126863

(51) Int. Cl.
| | |
|---|---|
| *H01L 51/50* | (2006.01) |
| *H10K 10/88* | (2023.01) |
| *H10K 50/11* | (2023.01) |
| *H10K 59/123* | (2023.01) |
| *H10K 50/842* | (2023.01) |
| *H10K 59/35* | (2023.01) |

(Continued)

(52) U.S. Cl.
CPC ............ *H10K 50/11* (2023.02); *H10K 10/88* (2023.02); *H10K 59/123* (2023.02); *H10K 50/8426* (2023.02); *H10K 59/35* (2023.02); *H10K 77/111* (2023.02); *H10K 2102/00* (2023.02)

(58) Field of Classification Search
CPC ............. H01L 27/3248; H01L 27/3297; H01L 51/107; H01L 51/5012; H01L 51/5246; H10K 10/88; H10K 50/11; H10K 59/123; H10K 59/35; H10K 77/111
See application file for complete search history.

(56) References Cited

U.S. PATENT DOCUMENTS 6,828,726 B2 * 12/2004 Sakurai ............... H01L 27/3246
                                                        313/498
6,900,084 B1 * 5/2005 Yamazaki ............... H01L 25/18
                                                        438/30

(Continued)

FOREIGN PATENT DOCUMENTS

| CN | 108091675 A | 5/2018 |
|---|---|---|
| CN | 108155300 A | 6/2018 |

(Continued)

*Primary Examiner* — Jay C Kim
(74) *Attorney, Agent, or Firm* — Innovation Counsel LLP

(57) ABSTRACT

A display apparatus includes: a substrate including a display area and a peripheral area; a thin-film encapsulation layer overlapping the display area and including an inorganic film and an organic film; a conductive layer located in the peripheral area; and a dam overlapping an outer edge of the conductive layer, wherein the dam includes a first inclined portion extending from a top surface of the dam toward the display area and at least partially overlapping the conductive layer and a second inclined portion extending in an opposite direction to the first inclined portion. A shape of the first inclined portion and a shape of the second inclined portion are asymmetric to each other.

13 Claims, 18 Drawing Sheets

(51) Int. Cl.
  *H10K 77/10* (2023.01)
  *H10K 102/00* (2023.01)

(56) References Cited

U.S. PATENT DOCUMENTS

| | | | | |
|---|---|---|---|---|
| 7,528,543 B2* | 5/2009 | Wang | H01L 51/0003 | 313/504 |
| 7,538,354 B2* | 5/2009 | Hayashi | H01L 51/5246 | 257/79 |
| 7,642,715 B2* | 1/2010 | Hayashi | H01L 51/5259 | 313/509 |
| 7,728,510 B2* | 6/2010 | Oh | H10K 50/82 | 313/504 |
| 7,786,668 B2* | 8/2010 | Hayashi | H01L 51/5246 | 313/504 |
| 7,812,345 B2* | 10/2010 | Yoshida | H01L 51/0003 | 257/40 |
| 7,902,751 B2* | 3/2011 | Hayashi | H10K 50/8426 | 313/506 |
| 7,910,271 B2* | 3/2011 | Inoue | H05B 33/26 | 430/394 |
| 7,915,823 B2* | 3/2011 | Hayashi | H01L 51/5253 | 313/512 |
| 8,023,302 B2* | 9/2011 | Yukawa | H01L 27/105 | 365/185.26 |
| 8,044,404 B2* | 10/2011 | Sung | H01L 27/3246 | 257/E27.111 |
| 8,062,695 B2* | 11/2011 | Matsuda | H10K 50/824 | 427/66 |
| 8,164,258 B2* | 4/2012 | Hayashi | H01L 51/5253 | 313/512 |
| RE43,442 E* | 6/2012 | Hayashi | H01L 51/5253 | 257/79 |
| 8,242,692 B2* | 8/2012 | Kim | H01L 51/5268 | 313/507 |
| 8,310,413 B2* | 11/2012 | Fish | H10K 50/824 | 345/76 |
| 8,432,334 B2* | 4/2013 | Bang | H10K 59/131 | 345/76 |
| 8,441,185 B2* | 5/2013 | Kuwabara | H01L 27/3246 | 313/506 |
| 8,525,404 B2* | 9/2013 | Jeon | H01L 27/3246 | 313/506 |
| 8,552,641 B2* | 10/2013 | Nakamura | G02F 1/1345 | 313/512 |
| 8,604,547 B2* | 12/2013 | Yukawa | G11C 17/146 | 257/350 |
| 8,628,986 B2* | 1/2014 | Amamiya | H01L 51/5004 | 438/29 |
| 8,680,513 B2* | 3/2014 | Jung | H01L 27/3246 | 428/690 |
| 8,835,205 B2* | 9/2014 | Park | H01L 27/3246 | 438/34 |
| 8,928,007 B2* | 1/2015 | Akagawa | H01L 27/3276 | 257/81 |
| 9,000,428 B2* | 4/2015 | Lee | H01L 27/3272 | 257/40 |
| 9,048,453 B2* | 6/2015 | Kawata | H10K 50/813 | |
| 9,054,059 B2* | 6/2015 | Kim | H01L 27/3246 | |
| 9,093,669 B2* | 7/2015 | Park | H10K 59/121 | |
| 9,147,721 B2* | 9/2015 | Hong | H10K 59/131 | |
| 9,401,392 B2* | 7/2016 | Beak | H10K 59/1213 | |
| 9,412,972 B2* | 8/2016 | Shim | H01L 51/5256 | |
| 9,419,245 B2* | 8/2016 | Kamiya | H01L 27/3246 | |
| 9,450,034 B2* | 9/2016 | Lee | H01L 27/3276 | |
| 9,466,648 B2* | 10/2016 | Kim | H01L 27/3279 | |
| 9,478,594 B2* | 10/2016 | Odaka | H10K 59/122 | |
| 9,478,770 B2* | 10/2016 | Kim | H01L 51/5203 | |
| 9,484,550 B2* | 11/2016 | Furuie | H01L 51/5253 | |
| 9,515,129 B2* | 12/2016 | Kim | H10K 59/1315 | |
| 9,583,739 B2* | 2/2017 | Hirakata | H01L 51/5218 | |
| 9,590,177 B2* | 3/2017 | Fang | H10K 59/124 | |
| 9,595,575 B2* | 3/2017 | Cho | H01L 27/3276 | |
| 9,601,717 B2* | 3/2017 | Lee | H01L 51/5246 | |
| 9,614,180 B2* | 4/2017 | Kang | H01L 27/3246 | |
| 9,647,233 B2* | 5/2017 | Kim | H01L 51/5256 | |
| 9,685,626 B2* | 6/2017 | Kim | H01L 51/5237 | |
| 9,716,248 B2* | 7/2017 | Visweswaran | H10K 77/111 | |
| 9,748,318 B2* | 8/2017 | Shim | H10K 50/824 | |
| 9,818,807 B2* | 11/2017 | Park | H01L 51/5253 | |
| 9,818,975 B2* | 11/2017 | Hong | H01L 27/3276 | |
| 9,825,110 B2* | 11/2017 | Park | H01L 51/5225 | |
| 9,837,632 B2* | 12/2017 | Cho | H01L 51/5237 | |
| 9,859,334 B2 | 1/2018 | Kim et al. | | |
| 9,876,194 B2* | 1/2018 | Lee | H01L 27/3262 | |
| 9,893,139 B2* | 2/2018 | Kim | H10K 59/1315 | |
| 9,893,312 B2* | 2/2018 | Park | H10K 50/844 | |
| 9,923,167 B2* | 3/2018 | Choi | H01L 51/5253 | |
| 9,929,220 B2* | 3/2018 | Yamazaki | H05B 33/12 | 257/E29.151 |
| 9,954,200 B2* | 4/2018 | Kim | H01L 51/5253 | |
| 9,972,693 B2* | 5/2018 | Kim | H10K 59/124 | |
| 9,997,427 B2* | 6/2018 | Chen | H01L 27/3276 | |
| 10,026,793 B2* | 7/2018 | Jeon | G09G 3/3233 | |
| 10,038,035 B2* | 7/2018 | Xu | H01L 27/3244 | |
| 10,050,100 B2* | 8/2018 | Lee | H01L 27/3279 | |
| 10,050,223 B2* | 8/2018 | Im | H10K 59/122 | |
| 10,052,863 B2* | 8/2018 | Wang | B41N 1/248 | |
| 10,069,105 B2* | 9/2018 | Hong | H10K 59/131 | |
| 10,135,025 B2* | 11/2018 | Kim | H10K 50/844 | |
| 10,170,534 B1* | 1/2019 | Kim | H01L 27/1248 | |
| 10,224,383 B2* | 3/2019 | Park | H01L 27/3246 | |
| 10,249,844 B2* | 4/2019 | Chou | H01L 51/5253 | |
| 10,333,101 B2* | 6/2019 | Shin | H10K 71/00 | |
| 10,388,905 B2* | 8/2019 | Choi | H10K 50/824 | |
| 10,388,911 B2* | 8/2019 | Hamada | H01L 27/3276 | |
| 10,403,852 B2* | 9/2019 | Kim | H01L 27/3223 | |
| 10,431,771 B2* | 10/2019 | Park | H01L 27/3211 | |
| 10,446,793 B2* | 10/2019 | Kim | H01L 27/3276 | |
| 10,516,012 B2* | 12/2019 | Ochi | G09F 9/30 | |
| 10,541,380 B1* | 1/2020 | Sung | H01L 21/76205 | |
| 10,559,772 B2* | 2/2020 | Ochi | H05B 33/04 | |
| 10,591,787 B2* | 3/2020 | Shim | H01L 27/14636 | |
| 10,600,854 B2* | 3/2020 | Kim | H01L 27/3276 | |
| 10,608,062 B2* | 3/2020 | Takahashi | H05B 33/04 | |
| 10,622,584 B2* | 4/2020 | Jiang | H10K 50/8426 | |
| 10,622,585 B2* | 4/2020 | Kim | H01L 51/5253 | |
| 10,635,209 B2* | 4/2020 | Seong | H10K 50/8428 | |
| 10,651,265 B2* | 5/2020 | Park | H01L 51/0097 | |
| 10,680,044 B2* | 6/2020 | Go | H01L 51/525 | |
| 10,699,852 B2* | 6/2020 | Jung | G06F 3/044 | |
| 10,727,433 B2* | 7/2020 | Lee | H10K 71/00 | |
| 10,743,425 B2* | 8/2020 | Park | H01L 51/5228 | |
| 10,749,140 B2* | 8/2020 | Park | H01L 51/5256 | |
| 10,754,482 B2* | 8/2020 | Cho | G06F 3/0412 | |
| 10,756,299 B2* | 8/2020 | Furuie | H10K 50/844 | |
| 10,804,353 B2* | 10/2020 | Choi | G09G 3/3225 | |
| 10,811,478 B2* | 10/2020 | Choi | H01L 27/3246 | |
| 11,309,517 B2* | 4/2022 | Seo | H10K 59/12 | |
| 2004/0135501 A1* | 7/2004 | Nishikawa | H01L 27/3246 | 313/506 |
| 2009/0200930 A1 | 8/2009 | Hayash | | |
| 2010/0052503 A1* | 3/2010 | Fukagawa | B82Y 30/00 | 313/483 |
| 2010/0295759 A1* | 11/2010 | Tanaka | H01L 51/5259 | 345/76 |
| 2015/0014647 A1* | 1/2015 | Cho | H01L 51/525 | 257/40 |
| 2015/0370391 A1* | 12/2015 | Chen | G06F 3/0412 | 345/173 |
| 2016/0260928 A1* | 9/2016 | Choi | H01L 51/5253 | |
| 2017/0033312 A1* | 2/2017 | Kim | H01L 27/3276 | |
| 2017/0221982 A1* | 8/2017 | Park | H01L 51/5271 | |
| 2017/0294501 A1 | 10/2017 | Jang et al. | | |
| 2017/0331058 A1* | 11/2017 | Seo | G09F 9/30 | |
| 2018/0032189 A1* | 2/2018 | Lee | G09G 3/3225 | |
| 2018/0033830 A1* | 2/2018 | Kim | G06F 3/0445 | |
| 2018/0159077 A1 | 6/2018 | Lee et al. | | |
| 2018/0226612 A1 | 8/2018 | Choi et al. | | |
| 2019/0019966 A1 | 1/2019 | Jiang et al. | | |

(56) References Cited

U.S. PATENT DOCUMENTS

| | | | | |
|---|---|---|---|---|
| 2019/0097162 A1* | 3/2019 | Wang | .................... | H10K 50/81 |
| 2019/0341576 A1 | 11/2019 | Ochi et al. | | |
| 2020/0091459 A1* | 3/2020 | Senoo | ....................... | G09F 9/30 |

FOREIGN PATENT DOCUMENTS

| | | | | | |
|---|---|---|---|---|---|
| CN | 108417608 A | | 8/2018 | | |
| JP | 1996-106151 A | | 4/1996 | | |
| JP | 2010-211983 | * | 9/2010 | .............. | G09F 9/30 |
| JP | 2011-070079 A | | 4/2011 | | |
| JP | 5976831 B2 | | 8/2016 | | |
| JP | WO 2019/064410 | * | 4/2019 | ............ | H05B 33/04 |
| KR | 10-2009-0087815 | | 8/2009 | | |
| KR | 10-2015-0007874 | | 1/2015 | | |
| KR | 10-2017-0117273 A | | 10/2017 | | |
| KR | 10-2017-0134903 A | | 12/2017 | | |
| KR | 10-2018-0091987 A | | 8/2018 | | |
| WO | 2018-061195 A1 | | 4/2018 | | |

* cited by examiner

DISPLAY APPARATUS AND MASK FOR MANUFACTURING THE SAME

CROSS-REFERENCE TO RELATED APPLICATION

This application claims the benefit of and priority to Korean Patent Application No. 10-2018-0126863, filed on Oct. 23, 2018, in the Korean Intellectual Property Office, the disclosure of which is incorporated herein in its entirety by reference.

BACKGROUND

1. Field

One or more embodiments of the present disclosure relate to a display apparatus and a mask for manufacturing the same, and more particularly, to a display apparatus including a dam that is located in a peripheral area and a mask for manufacturing the display apparatus.

2. Description of the Related Art

Display apparatuses provide visual data to a user. A display apparatus includes a substrate that is divided into a display area and a peripheral area outside the display area. A scan line and a data line that are insulated from each other are formed in the display area, and a plurality of pixels connected to the scan line and the data line are located in the display area. In addition, thin-film transistors (TFTs) respectively corresponding to the pixels and a pixel electrode electrically connected to each TFT are provided in the display area. A counter electrode that is commonly provided for the pixels is provided in the display area. Various wirings for transmitting electrical signals to the display area, a scan driver, a data driver, and a controller may be provided in the peripheral area.

Technology for sealing the display area to protect the display area from moisture and/or external air has been actively studied.

SUMMARY

One or more embodiments of the present disclosure include a display apparatus and a mask for manufacturing the same, and more particularly, a display apparatus including a dam located in a peripheral area and a mask for manufacturing the display apparatus. Additional aspects of the present disclosure will be set forth in part in the following description and, in part, will be apparent from the description or may be learned by practice of the presented embodiments herein.

According to one or more embodiments, a display apparatus includes: a substrate including a display area displaying an image and a peripheral area located around the display area; a thin-film encapsulation layer overlapping the display area and including at least one inorganic film and at least one organic film; a conductive layer located in the peripheral area and surrounding at least a portion of the display area; and a dam overlapping an outer edge of the conductive layer, wherein the dam includes a first inclined portion extending from a top surface of the dam toward the display area and at least partially overlapping the conductive layer and a second inclined portion extending in an opposite direction to the first inclined portion, wherein a shape of the first inclined portion and a shape of the second inclined portion are asymmetric to each other about a central line that passes through the top surface of the dam and is perpendicular to a top surface of the substrate.

A first angle of an end of the first inclined portion with respect to a top surface of the conductive layer may be less than a second angle of an end of the second inclined portion with respect to the top surface of the substrate.

The second inclined portion may include a recess portion having a first height and an adhesion-enhancing portion located outside the recess portion, and wherein the adhesion-enhancing portion has a second height equal to or greater than the first height.

The first inclined portion may have a first inclination angle that is gentler than a second inclination angle of the second inclined portion, and the second inclined portion has a stepped shape.

The dam may have a stacked structure including a first layer and a second layer that covers a top surface and a side surface of the first layer, and a first inclination angle of the first inclined portion may be gentler than a second inclination angle of the first layer.

The display apparatus may further include: a touchscreen layer located on the thin-film encapsulation layer; and a touch wiring connected to the touchscreen layer and extending to the peripheral area, wherein the touch wiring covers the dam.

The display apparatus may further include an inner dam located between the display area and the dam, wherein the inner dam has a first height less than a second height of the dam.

The display apparatus may further include: an inorganic insulating layer located in the peripheral area and having an opening or a groove; and an organic layer filling at least a portion of the opening or the groove, wherein the substrate has a bending area located between a first area and a second area and is bent about a bending axis, wherein the opening or the groove overlaps the bending area.

The display apparatus may further include: a touchscreen layer located on the thin-film encapsulation layer in the display area; a touch wiring extending from the touchscreen layer to an outer edge of the dam; and a connection wiring connected to the touch wiring and located on the organic layer.

The display apparatus may further include: a thin-film transistor located in the display area and including a semiconductor layer, a source electrode, a drain electrode, and a gate electrode; and a display device located in the display area and including a pixel electrode, an intermediate layer, and a counter electrode, wherein the conductive layer is located on a same layer as the source electrode or the drain electrode and is electrically connected to the counter electrode.

The display apparatus may further include a connection conductive layer located between the conductive layer and the counter electrode, wherein the connection conductive layer is formed of a same material as a material of the pixel electrode.

The dam may partially contact the connection conductive layer.

The display apparatus may further include a fan-out wiring located in the peripheral area on a same layer as the gate electrode, wherein the fan-out wiring partially overlaps the conductive layer.

According to one or more embodiments, a display apparatus includes: a substrate including a display area displaying an image and a peripheral area located around the display area; a thin-film encapsulation layer overlapping the display area and including at least one inorganic film and at least one organic film; and a dam located in the peripheral area and surrounding at least a portion of the display area, wherein the dam includes a first inclined portion extending from a top surface of the dam toward the display area and a second inclined portion extending in an opposite direction to the first inclined portion, wherein the second inclined portion includes a recess portion having a first height and an adhesion-enhancing portion located outside the recess portion and having a second height that is greater than the first height.

The display apparatus may further include an interlayer insulating layer located between the substrate and the dam and including an inorganic material, wherein an end of the first inclined portion and an end of the second inclined portion contact the interlayer insulating layer, and a shape of the first inclined portion is a mirror image of a shape of the second inclined portion.

The first inclined portion may have a first inclination angle that is gentler than a second inclination angle of the second inclined portion, and the second inclined portion may have a stepped shape.

The display apparatus may further include a conductive layer located under the dam and at least partially overlapping the first inclined portion of the dam, wherein the first inclined portion has a first inclination angle that is gentler than a second inclination angle of the second inclined portion.

According to one or more embodiments, a mask for manufacturing the display apparatus includes: a first pattern corresponding to the first inclined portion; a second pattern corresponding to a top surface of the dam; and a third pattern corresponding to the second inclined portion, wherein the first pattern and the third pattern are different from each other.

The first pattern may be a half-tone mask pattern, and the third pattern may include a half-tone mask pattern and a full-tone mask pattern that are alternately located.

The third pattern may include a plurality of half-tone mask patterns and a plurality of full-tone mask patterns that are alternately located.

The second pattern may include a full-tone mask pattern, and a portion of the third pattern close to the second pattern may include a half-tone mask pattern and a portion of the third pattern away from the second pattern may include a full-tone mask pattern.

BRIEF DESCRIPTION OF THE DRAWINGS

These and/or other aspects of the present disclosure will become apparent and more readily appreciated from the following description of the embodiments, taken in conjunction with the accompanying drawings in which.

DETAILED DESCRIPTION

Figure 1:
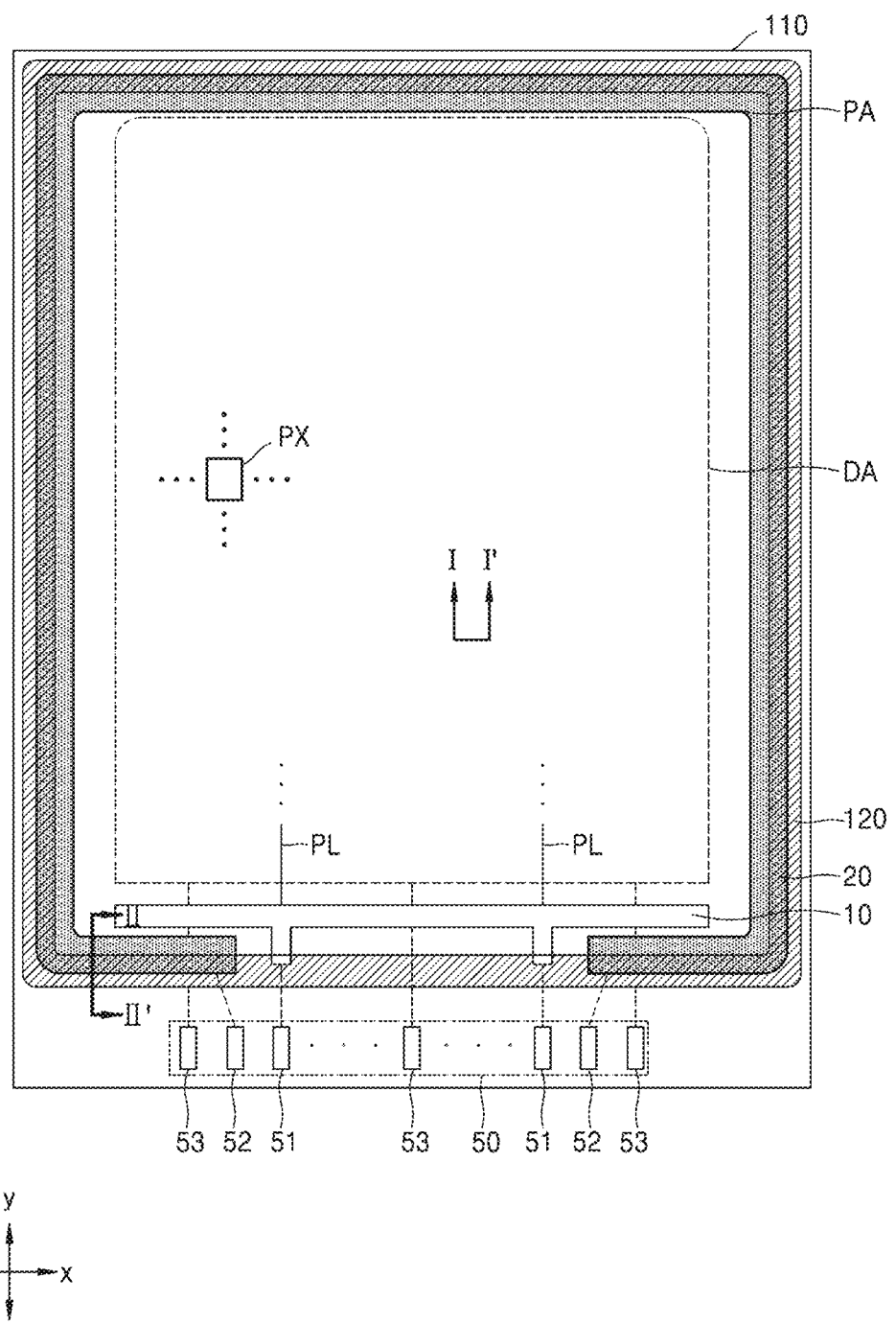
FIG. 1 is a plan view of a display apparatus according to an embodiment.

The present disclosure may include various embodiments and modifications, and some embodiments thereof will be illustrated in the drawings and will be described herein in detail. The effects and features of the present disclosure and the accompanying methods thereof will become apparent from the following description of the embodiments, taken in conjunction with the accompanying drawings. However, the present disclosure is not limited to the embodiments described below, and may be embodied in various modes and configurations without deviating from the scope of the present disclosure.

Reference will now be made in detail to embodiments, examples of which are illustrated in the accompanying drawings. In the drawings, the same elements are denoted by the same reference numerals, and repeated explanation thereof may be omitted.

It will be understood that although the terms "first," "second," etc. may be used herein to describe various elements, these elements should not be limited by these terms. These elements are only used to distinguish one element from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or element is referred to as being "formed on," another layer, region, or element, it may be directly or indirectly formed on the other layer, region, or element. That is, for example, one or more intervening layers, regions, or elements may be present.

Sizes of elements in the drawings may be exaggerated for convenience of explanation. In other words, since sizes and thicknesses of elements in the drawings are arbitrarily illustrated for convenience of explanation, the present disclosure is not limited thereto.

It will be understood that when a layer, region, or element is referred to as being "connected", the layer, the region, or the element may be directly connected or may be indirectly connected with one or more intervening layers, regions, or elements therebetween. For example, when a layer, a region, or an element is electrically connected, the layer, the region, or the element may be directly electrically connected or may be indirectly electrically connected with one or more intervening layers, regions, or elements therebetween.

Examples of a display apparatus for displaying an image may include a liquid crystal display, an electrophoretic display, an organic light-emitting display, an inorganic electroluminescent (EL) display, a field emission display, a surface-conduction electron-emitter display, a plasma display, and a cathode ray tube display.

Although an organic light-emitting display is described as a display apparatus according to some embodiments of the present disclosure, the display apparatus of the present disclosure is not limited thereto and may be any of other types of display apparatuses.

As used herein, the term "and/or" includes any and all combinations of one or more of the associated listed items. Expressions such as "at least one of", when preceding a list of elements, may modify the entire list of elements and do not modify the individual elements of the list.

FIG. 1 is a plan view of a display apparatus according to an embodiment.

Referring to FIG. 1, a substrate 110 of the display apparatus is divided into a display area DA and a peripheral area PA that is located around the display area DA. In the display area DA, a plurality of pixels PX are located and an image is displayed. The plurality of pixels PX may be connected to a scan line and a data line that intersects the scan line. In addition, the plurality of pixels PX may be connected to a plurality of driving voltage lines PL.

Each of the pixels PX emits, for example, red, green, blue, or white light, and may include, for example, an organic light-emitting diode device (e.g., an organic light-emitting diode). In addition, each pixel PX may further include one or more devices such as a thin-film transistor (TFT) and a storage capacitor. The display area DA provides an image by using light emitted from the pixels PX. The pixel PX may refer to a sub-pixel emitting red, green, blue, or white light as described above. In some embodiment, the pixel PX may refer to a combination of two or more sub-pixels.

The peripheral area PA where the pixels PX are not located does not provide an image. A first power supply voltage line 10 and a conductive layer 20 that may be used as a second power supply voltage line may be located in the peripheral area PA to apply different power supply voltages. In addition, a scan driver (not shown) and a pad unit 50 may be located in the peripheral area PA.

A dam 120 surrounding at least a portion of the display area DA may be located in the peripheral area PA. The dam 120 may protrude from the substrate 110 to contain a flow of an organic material when an organic encapsulation layer (e.g., an organic encapsulation layer 420 shown in FIG. 2) for sealing the display area DA is formed.

As shown in FIG. 1, the dam 120 may continuously surround the display area DA. However, the present disclosure is not limited thereto, and the dam 120 may be configured, formed, and/or located in various ways. For example, the dam 120 may partially surround the display area DA or may surround the display area DA in a dotted line pattern.

The dam 120 may partially overlap the conductive layer 20. In some embodiments, the dam 120 may cover an outer edge of the conductive layer 20. An inner dam (not shown) that is located in the display area DA and/or an outer dam located on an edge of the substrate 110 may be further provided. The inner dam and/or the outer dam may be connected to or spaced apart from the dam 120.

The first power supply voltage line 10 may be located in the peripheral area PA to correspond to a lower portion of the display area DA. In other embodiments, the first power supply voltage line 10 may be located in the peripheral area PA to correspond to a side portion or an upper portion of the display area DA. The plurality of driving voltage lines PL for transmitting driving voltages to the plurality of pixels PX that are located in the display area DA may be connected to the first power supply voltage line 10. The first power supply voltage line 10 may be connected to one or more pads 51 of the pad unit 50.

The conductive layer 20 may be located in the peripheral area PA and may partially surround the display area DA. In some embodiments, the conductive layer 20 may extend along sides except one side of the display area DA that is adjacent to the first power supply voltage line 10. However, the present embodiment is not limited thereto, and the conductive layer 20 may be configured, formed, and/or located in various ways. For example, the conductive layer 20 may correspond to one side or two sides of the display area DA. The conductive layer 20 may be connected to one or more pads 52 of the pad unit 50.

The scan driver (not shown) may be located in the peripheral area PA at one side or two sides, for example, a left side, a right side, or both sides of the display area DA. A scan signal generated by the scan driver may be applied to the pixels PX through the scan line. However, the present disclosure is not limited thereto. The scan driver may not be located in the peripheral area PA, and may be located in a printed circuit board (PCB) or the like.

The pad unit 50 is located in the peripheral area PA and includes the plurality of pads 51, 52, and 53. The pad unit 50 may be exposed without being covered by an insulating layer, and may be electrically connected to a controller (not shown) such as a flexible PCB and a driver integrated circuit (IC) chip. The controller may convert a plurality of external image signals into a plurality of image data signals and apply the image data signals to the display area DA through the pad unit 50. In addition, the controller may receive other signals including, but not limited to, a vertical synchronization signal, a horizontal synchronization signal, and a clock signal, may generate a control signal for controlling an operation of the scan driver, and may transmit the control signal to the scan driver through the pad unit 50. The controller may transmit voltages to the first power supply voltage line 10 and the conductive layer 20 through the pad unit 50. The voltages transmitted to the first power supply voltage line 10 and the conductive layer 20 may be different from each other. The pad unit 50 may be connected to a plurality of fan-out wirings 60 shown in FIG. 2, and may transmit one or more voltages and various signals to the display area DA.

The first power supply voltage line 10 may supply a first power supply voltage ELVDD to each pixel PX, and the conductive layer 20 may supply a second power supply voltage ELVSS to each pixel PX. For example, the first power supply voltage ELVDD may be supplied to each pixel PX through the driving voltage line PL that is connected to the first power supply voltage line 10. The second power supply voltage ELVSS may be supplied to a counter electrode (not shown) of the organic light-emitting device of each pixel PX in the peripheral area PA.

The fan-out wirings 60 may be connected to the pads 51, 52, and 53 of the pad unit 50, and may transmit an electrical signal received from the controller to the display area DA.

That is, the fan-out wirings 60 may be connected to the pad unit 50 and may extend to the display area DA.

A structure in which elements included in the display apparatus are stacked will be described with reference to FIGS. 2 and 3.

Figure 2:
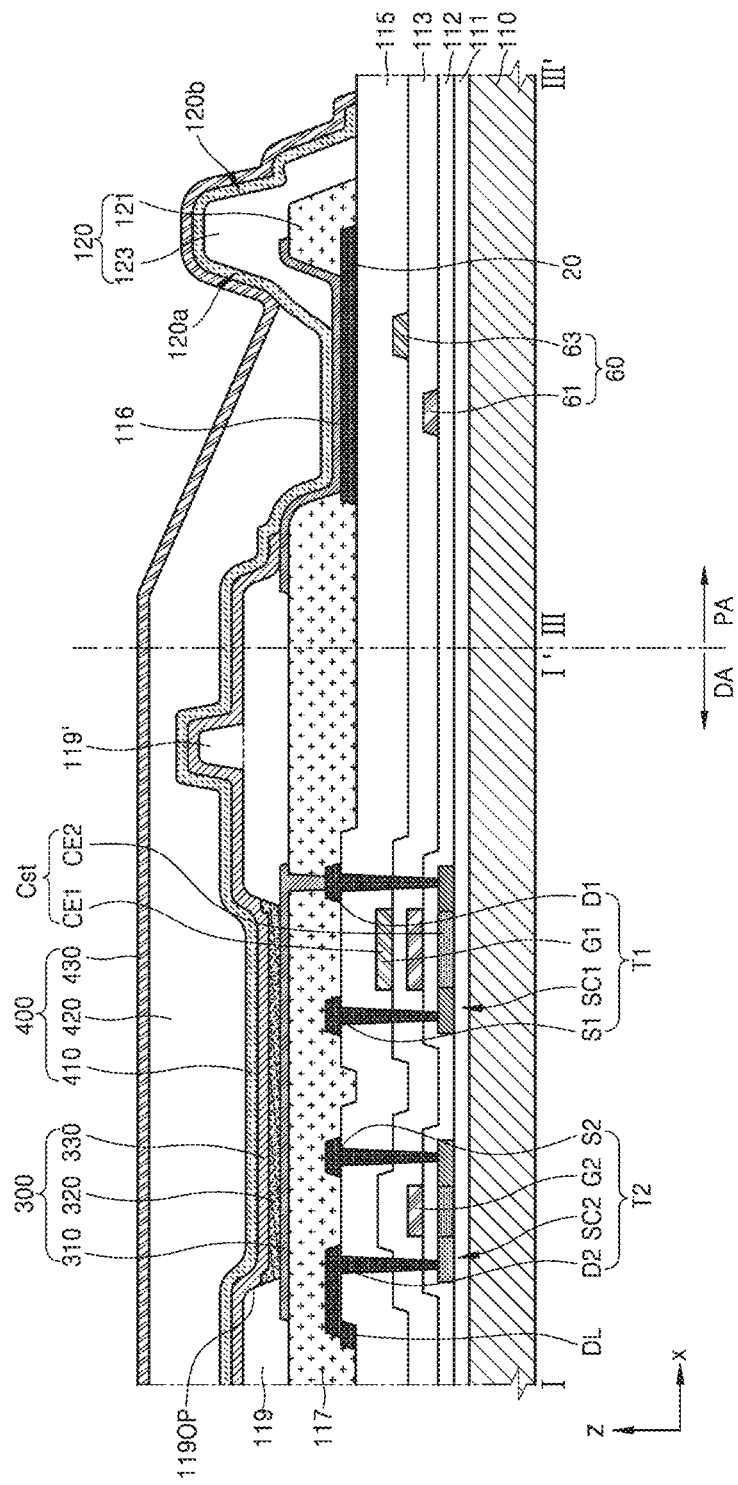
FIG. 2 is a cross-sectional view taken along lines I-I' and II-II' of FIG. 1.

FIG. 2 is a cross-sectional view taken along lines I-I' and II-II' of the display apparatus of FIG. 1. FIG. 3 is a cross-sectional view illustrating a portion of the display apparatus according to an embodiment. In detail, FIG. 3 illustrates a portion of the display apparatus where the dam 120 is formed.

The substrate 110 may be formed of any of various materials such as a glass material, a metal material, and a plastic material. According to an embodiment, the substrate 110 may be a flexible substrate, and may include a polymer resin such as polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), and cellulose acetate propionate (CAP).

A buffer layer 111 may be located on the substrate 110. The buffer layer 111 may reduce or prevent penetration of a foreign material, moisture, or external air from the bottom of the substrate 110 and may simultaneously planarize the substrate 110. The buffer layer 111 may include an inorganic material such as an oxide and a nitride, an organic material, or a combination of an inorganic material and an organic material., The buffer layer 111 may have a single or multi-layer structure including an inorganic material and an organic material. A barrier layer (not shown) for preventing penetration of external air may be further provided between the substrate 110 and the buffer layer 111.

A first TFT T1 including a semiconductor layer SC1, a gate electrode G1, a source electrode S1, and a drain electrode D1, and a second TFT T2 including a semiconductor layer SC2, a gate electrode G2, a source electrode S2, and a drain electrode D2 are located on the buffer layer 111. The first TFT T1 may be connected to an organic light-emitting device 300 and may serve as a driving TFT for driving the organic light-emitting device 300. The second TFT T2 may be connected to a data line DL and may serve as a switching TFT. However, the present disclosure is not limited thereto. For example, the first TFT T1 may serve as a switching TFT and the second TFT T2 may serve as a driving TFT. Although two TFTs are illustrated in FIG. 2, the present embodiment is not limited thereto, and the number of TFTs included in a pixel PX may be changed in various ways. For example, the number of TFTs included in a pixel PX may be between 2 and 7.

Each of the semiconductor layers SC1 and SC2 may include amorphous silicon or polycrystalline silicon. In another embodiment, each of the semiconductor layers SC1 and SC2 may include an oxide of at least one material selected from the group consisting of indium (In), gallium (Ga), stanium (Sn), zirconium (Zr), vanadium (V), hafnium (Hf), cadmium (Cd), germanium (Ge), chromium (Cr), titanium (Ti), and zinc (Zn). Each of the semiconductor layers SC1 and SC2 may include a source region and a drain region that are doped with impurities and a channel region.

The gate electrodes G1 and G2 are respectively located on the semiconductor layers SC1 and SC2 with a first gate insulating layer 112 interposed therebetween. Each of the gate electrodes G1 and G2 may include molybdenum (Mo), aluminum (Al), copper (Cu), and/or titanium (Ti), and may have a single or multi-layer structure. For example, the gate electrodes G1 and G2 may have a single-layer structure including Mo.

The first gate insulating layer 112 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$).

A second gate insulating layer 113 may cover the gate electrodes G1 and G2. The second gate insulating layer 113 may include $SiO_2$, $SiN_x$, SiON, $Al_2O_3$, $TiO_2$, $Ta_2O_5$, $HfO_2$, and/or $ZnO_2$.

A storage capacitor Cst including a first electrode CE1 and a second electrode CE2 may be located in the display area DA. The first electrode CE1 of the storage capacitor Cst may overlap the first TFT T1. For example, the gate electrode G1 of the first TFT T1 may serve as the first electrode CE1 of the storage capacitor Cst.

The second electrode CE2 of the storage capacitor Cst may overlap the first electrode CE1 with the second gate insulating layer 113 interposed therebetween. In this case, the second gate insulating layer 113 may serve as a dielectric layer of the storage capacitor Cst. The second electrode CE2 may include a conductive material such as Mo, Al, Cu, and Ti, and may have a single or multi-layer structure including the conductive material. For example, the second electrode CE2 may have a single-layer structure including Mo or a multi-layer structure including Mo/Al/Mo.

Although FIG. 2 shows that the storage capacitor Cst overlaps the first TFT T1, the present disclosure is not limited thereto, and the storage capacitor Cst may be configured, formed, and/or located in various ways. For example, the storage capacitor Cst may not overlap the first TFT T1.

The source electrodes S1 and S2 and the drain electrodes D1 and D2 may be located on an interlayer insulating layer 115. Each of the source electrodes S1 and S2 and the drain electrodes D1 and D2 may include a conductive material such as Mo, Al, Cu, and Ti, and may have a single or multi-layer structure including the conductive material. For example, each of the source electrodes S1 and S2 and the drain electrodes D1 and D2 may have a multi-layer structure including Ti/Al/Ti.

A planarization layer 117 may be located on the source electrodes S1 and S2 and the drain electrodes D1 and D2, and the organic light-emitting device 300 may be located on the planarization layer 117.

The planarization layer 117 may have a flat top surface. A pixel electrode 310 of the organic light-emitting device 300 may be located on the planarization layer 117. The pixel electrode 310 that is located on the planarization layer 117 may also have a flat top surface. The planarization layer 117 may have a single or multi-layer structure including an organic material. For example, the planarization layer 117 may include benzocyclobutene (BCB), PI, hexamethyldisiloxane (HMDSO), a general-purpose polymer such as polymethyl methacrylate (PMMA) and polystyrene (PS), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, and a blend thereof. In another example, the planarization layer 117 may include an inorganic material such as $SiO_2$, $SiN_x$, SiON, $Al_2O_3$, $TiO_2$, $Ta_2O_5$, $HfO_2$, and $ZnO_2$. When the planarization layer 117 includes an inorganic material, chemical-mechanical polishing may be performed if needed. The planarization layer 117 may include both an organic material and an inorganic material.

In the display area DA of the substrate 110, the organic light-emitting device 300 may be located on the planarization layer 117. The organic light-emitting device 300 includes the pixel electrode 310, an intermediate layer 320, and a counter electrode 330.

An opening through which any one of the source electrode S1 and the drain electrode D1 of the first TFT T1 is exposed is formed in the planarization layer 117, and the pixel electrode 310 contacts the source electrode S1 or the drain electrode D1 through the opening and is electrically connected to the first TFT T1.

According to one embodiment, the pixel electrode 310 may be a (semi)light-transmitting electrode or a reflective electrode. In some embodiments, the pixel electrode 310 may include a reflective film formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent or semi-transparent electrode layer that is formed on the reflective film. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In some embodiments, the pixel electrode 310 may have a stacked structure including ITO/Ag/ITO.

A pixel-defining film 119 may be located on the planarization layer 117, and may define an emission area of a pixel by having an opening 1190P that corresponds to each sub-pixel in the display area DA. The opening 1190P exposes at least a central portion of the pixel electrode 310. In addition, the pixel-defining film 119 may prevent an arc or the like from occurring on an edge of the pixel electrode 310 by increasing a distance between the edge of the pixel electrode 310 and the counter electrode 330 that is located on the pixel electrode 310. The pixel-defining film 119 may be formed of an organic insulating material such as PI, polyamide, acrylic resin, HMDSO, and phenolic resin by using spin coating or the like.

A spacer 119' may be provided on the pixel-defining film 119. The spacer 119' may protrude from the pixel-defining film 119 and may prevent a damage to a mask during a process of forming the pixel-defining film 119. The spacer 119' may be formed of an organic insulating material such as PI, polyamide, acrylic resin, BCB, HMDSO, and phenolic resin by using spin coating or the like. The spacer 119' may be integrally formed with the pixel-defining film 119. That is, the spacer 119' and the pixel-defining film 119 may be simultaneously formed of the same material by using the same mask process. In this case, the mask may include a full-tone area corresponding to the spacer 119' and a half-tone area corresponding to the pixel-defining film 119.

The intermediate layer 320 of the organic light-emitting device 300 may include an organic emission layer. The organic emission layer may include an organic material including a fluorescent or phosphorescent material that emits red, green, blue, or white light. The organic emission layer may be formed of a low molecular weight organic material or a high molecular weight organic material. Functional layers such as a hole transport layer (HTL), a hole injection layer (HIL), an electron transport layer (ETL), and an electron injection layer (EIL) may be selectively located under and/or over the organic emission layer. The intermediate layer 320 may correspond to each of the plurality of pixel electrodes 310. However, the present embodiment is not limited thereto, and the intermediate layer 320 may be located in various ways. For example, the intermediate layer 320 may be located entirely over the pixel electrodes 310 of the pixels PX located in the display area DA.

The counter electrode 330 may be a light-transmitting electrode or a reflective electrode. In some embodiments, the counter electrode 330 may be a transparent or semi-transparent electrode, and may include a metal thin film including lithium (Li), calcium (Ca), lithium fluoride (LiF)/Ca, LiF/Al, Al, Ag, Mg, and/or a compound thereof. In addition, a transparent conductive oxide (TCO) film such as an ITO, IZO, ZnO, and $In_2O_3$ may be further located on the metal thin film. The counter electrode 330 may be located in both the display area DA and the peripheral area PA, and may be located on the intermediate layer 320 and the pixel-defining film 119. The counter electrode 330 may be integrally formed in a plurality of the organic light-emitting devices 300 and may correspond to the pixel electrodes 310.

When the pixel electrode 310 is a reflective electrode, and the counter electrode 330 is a light-transmitting electrode, light emitted by the intermediate layer 320 may be emitted toward the counter electrode 330, and the display apparatus may be a top emission display apparatus. When the pixel electrode 310 is a transparent or semi-transparent electrode and the counter electrode 330 is a reflective electrode, light emitted by the intermediate layer 320 may be emitted toward the substrate 110, and the display apparatus may be a bottom emission display apparatus. However, the present embodiment is not limited thereto. The display apparatus of the present embodiment may be a dual emission display apparatus that emits light toward a top surface and a bottom surface.

A thin-film encapsulation layer 400 may cover the display area DA and the peripheral area PA and may prevent penetration of external moisture and oxygen. The thin-film encapsulation layer 400 may include at least one organic encapsulation layer and at least one inorganic encapsulation layer. Although FIG. 2 shows that the thin-film encapsulation layer 400 includes two inorganic encapsulation layers (e.g., a first inorganic encapsulation layers 410 and a second inorganic encapsulation layer 430) and one organic encapsulation layer (e.g., the organic encapsulation layer 420), an order in which those layers are stacked and the number of stacked layers are not limited to the example shown in FIG. 2.

The first inorganic encapsulation layer 410 may cover the counter electrode 330, and may include silicon oxide, silicon nitride, and/or silicon oxynitride. If necessary, another layer such as a capping layer may be located between the first inorganic encapsulation layer 410 and the counter electrode 330. Due to the underlying layers that are not flat, a top surface of the first inorganic encapsulation layer 410 may not be flat as shown in FIG. 2. The organic encapsulation layer 420 may cover the first inorganic encapsulation layer 410 to have a flat top surface. In detail, the organic encapsulation layer 420 may be formed so that a portion corresponding to the display area DA has a flat top surface. The organic encapsulation layer 420 may include at least one material selected from the group consisting of PET, PEN, PC, PI, polyethylene sulfonate, polyoxymethylene, polyarylate, and HMDSO. The second inorganic encapsulation layer 430 may cover the organic encapsulation layer 420, and may include silicon oxide, silicon nitride, and/or silicon oxynitride.

Since the thin-film encapsulation layer 400 has a multi-layer structure including the first inorganic encapsulation layer 410, the organic encapsulation layer 420, and the second inorganic encapsulation layer 430, even when cracks occur in the thin-film encapsulation layer 400, the cracks may not be connected between the first inorganic encapsulation layer 410 and the organic encapsulation layer 420 or between the organic encapsulation layer 420 and the second inorganic encapsulation layer 430. Accordingly, a path through which external moisture or oxygen penetrates into the display area DA and the peripheral area PA may be prevented or reduced. The second inorganic encapsulation layer 430 may contact the first inorganic encapsulation layer 410 at an edge outside the display area DA to prevent the organic encapsulation layer 420 from being exposed to the outside.

The dam 120 may be located in the peripheral area PA of the substrate 110. In addition, the conductive layer 20 and the fan-out wirings 60 may be located in the peripheral area PA.

The conductive layer 20 may serve as a wiring for supplying power to the display area DA, and may be formed by using the same material on the same layer as the source electrodes S1 and S2 and the drain electrodes D1 and D2. The conductive layer 20 may be located on the interlayer insulating layer 115. In some embodiments, the conductive layer 20 may be connected to the counter electrode 330 of the organic light-emitting device 300 and may serve as a wiring for supplying the second power supply voltage ELVSS.

As shown in FIG. 2, the conductive layer 20 is connected to the counter electrode 330 via a connection conductive layer 116. In some embodiments, the connection conductive layer 116 may extend to a top surface of a first layer 121 of the dam 120. However, the present disclosure is not limited thereto, and the conductive layer 20 may be configured, formed, and/or located in various ways. For example, the conductive layer 20 may directly contact the counter electrode 330.

In some embodiments, the connection conductive layer 116 and the pixel electrode 310 may be simultaneously formed by using the same material. The connection conductive layer 116 may include a reflective film formed of Ag, Mg, Al, Pt, Pd, Au, Ni, Nd, Ir, Cr, or a compound thereof, and a transparent or semi-transparent electrode layer that is formed on the reflective film. The transparent or semi-transparent electrode layer may include at least one selected from the group consisting of ITO, IZO, ZnO, $In_2O_3$, IGO, and AZO.

The fan-out wirings 60 may be located in the peripheral area PA. The fan-out wirings 60 may include a first fan-out wiring 61 and a second fan-out wiring 63 that may be located on different layers. The fan-out wirings 60 may be connected to wirings in the display area DA, and may transmit various electrical signals such as a data signal, a gate signal, and a driving voltage to the display area DA.

The first fan-out wiring 61 and the gate electrodes G1 and G2 may be located on the same layer. That is, the first fan-out wiring 61 may be located on the first gate insulating layer 112. The first fan-out wiring 61 and the gate electrodes G1 and G2 may be formed of the same material.

The second fan-out wiring 63 and the second electrode CE2 of the storage capacitor Cst may be located on the same layer. That is, the second fan-out wiring 63 may be located on the second gate insulating layer 113. The second fan-out wiring 63 and the second electrode CE2 may be formed of the same material. The second gate insulating layer 113 may be located between the first fan-out wiring 61 and the second fan-out wiring 63. In some embodiments, the first fan-out wiring 61 and the second fan-out wiring 63 may overlap each other to reduce a space.

Each of the fan-out wirings 60 may include Mo, Al, Cu, or Ti, and may have a single or multi-layer structure. For example, the fan-out wiring 60 may have a single-layer structure including Mo.

In some embodiments, the fan-out wiring 60 may partially overlap the conductive layer 20. However, the present embodiment is not limited thereto. The fan-out wiring 60 may not overlap the conductive layer 20 or entirely overlap the conductive layer 20.

The dam 120 may prevent formation of an edge tail of the organic encapsulation layer 420 by blocking a flow of an organic material toward an edge of the substrate 110 in a process of forming the organic encapsulation layer 420 of the thin-film encapsulation layer 400 for sealing the display area DA and the peripheral area PA.

The dam 120 may cover at least a portion of the conductive layer 20 and/or the connection conductive layer 116. In some embodiments, the dam 120 may cover an edge portion of the conductive layer 20 that is away from the display area DA. An edge portion of the conductive layer 20 that is close to the display area DA may be covered by the planarization layer 117. Since the edge portion(s) of the conductive layer 20 is(are) covered by the dam 120 or/and the planarization layer 117, the conductive layer 20 may be protected from corrosion that may occur during a process.

Since the dam 120 covers a portion of the conductive layer 20, a portion of the dam 120 may contact the conductive layer 20 and/or the connection conductive layer 116, and another portion of the dam 120 may contact the interlayer insulating layer 115.

The dam 120 may be formed of an organic insulating material such as PI, polyamide, acrylic resin, BCB, HMDSO, and phenolic resin. The dam 120 may be formed of a photosensitive organic material. An adhesive force between the organic material of the dam 120 and a conductive material of the conductive layer 20 and/or the connection conductive layer 116 may be greater than an adhesive force between the organic material of the dam 120 and an inorganic material of the interlayer insulating layer 115.

In the present embodiment, a profile of the dam 120 may be determined to increase an adhesive force between the dam 120 and a material located under the dam 120. That is, shapes of inclined portions 120a and 120b of the dam 120 may be different from according to the material(s) located under the dam 120.

The dam 120 may include the first inclined portion 120a that extends from a top surface of the dam 120 toward the display area DA and the second inclined portion 120b that extends in an opposite direction to the first inclined portion 120a.

In the present embodiment, a portion of the dam 120 including the first inclined portion 120a may contact the conductive layer 20 and/or the connection conductive layer 116, and a portion of the dam 120 including the second inclined portion 120b may contact the interlayer insulating layer 115. Due to the difference of the adhesive forces, a shape of the first inclined portion 120a may be different from a shape of the second inclined portion 120b. A shape of the first inclined portion 120a and a shape of the second inclined portion 120b will be described in detail below with reference to FIG. 3.

The dam 120 may include a plurality of layers. In some embodiments, the dam 120 may have a structure in which the first layer 121 and a second layer 123 are stacked. The first layer 121 may be formed of the same material as that of the planarization layer 117, and the second layer 123 may be formed of the same material as that of the pixel-defining film 119 and/or the spacer 119'. In this case, the second layer 123 may cover both a top surface and a side surface of the first layer 121. Accordingly, the second layer 123 may directly contact a top surface of the interlayer insulating layer 115 and a top surface of the connection conductive layer 116.

Although FIG. 2 shows that the dam 120 includes a plurality of layers, the dam 120 may have a single-layer structure in other embodiments. In this case, the dam 120 may be formed of the same material as that of the planarization layer 117 or the pixel-defining film 119.

Figure 3:
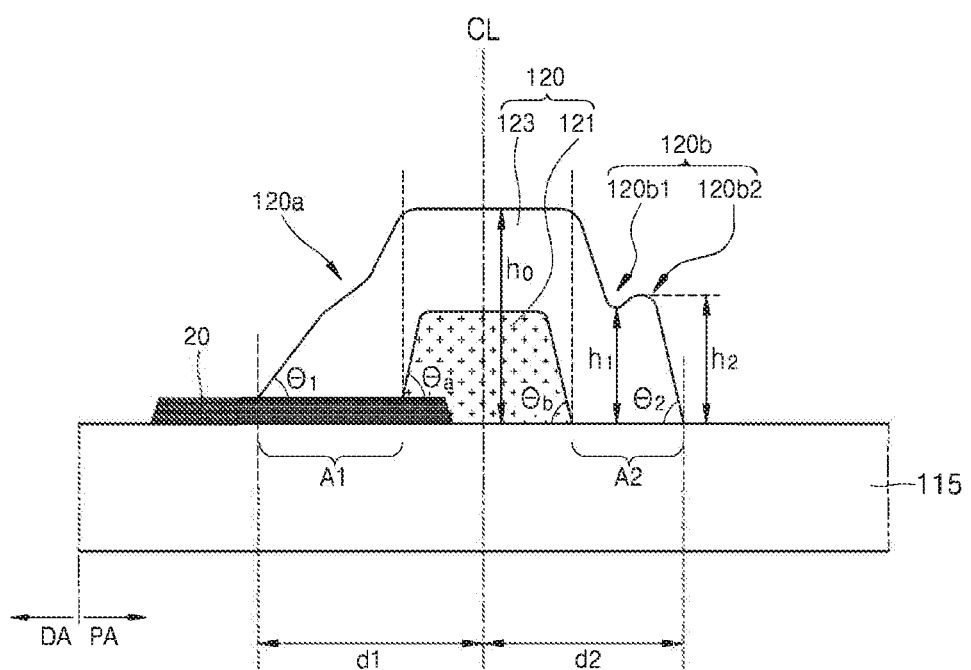
FIG. 3 is a cross-sectional view illustrating a portion of the display apparatus according to an embodiment.
Figure 4:
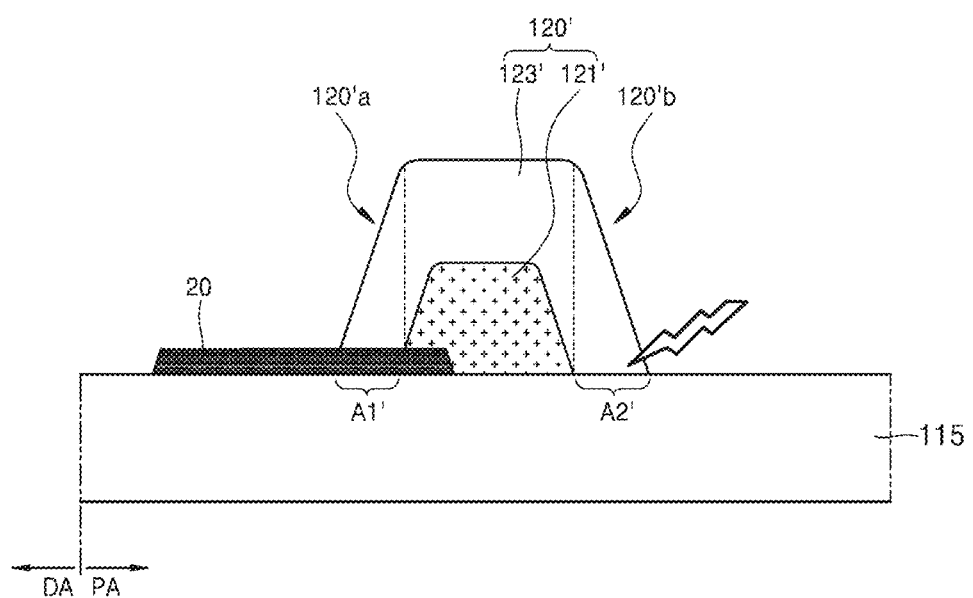
FIG. 4 is a view illustrating a comparative example for the purpose of comparison with the embodiment of FIG. 3.

FIG. 3 is a cross-sectional view illustrating the dam 120 of the display apparatus according to an embodiment. FIG. 4 is a cross-sectional view illustrating a comparative example for the purpose of comparison with the embodiment of FIG. 3. In FIGS. 3 and 4, the same elements as those in FIG. 2 are denoted by the same reference numerals, and thus repeated explanation thereof may be omitted. In FIG. 3, the connection conductive layer 116 is omitted for the sake of concise explanation.

Referring to FIG. 3, the dam 120 includes the first inclined portion 120a that extends from a top surface of the dam 120 to the display area DA and the second inclined portion 120b that extends in an opposite direction to the first inclined portion 120a.

In the present embodiment, a first portion A1 that includes the first inclined portion 120a overlaps the conductive layer 20, and a second portion A2 that includes the second inclined portion 120b contacts the interlayer insulating layer 115 that may be formed of an inorganic material. In the present embodiment, shapes of the first inclined portion 120a and the second inclined portion 120b may be different according to materials located under the first and second inclined portions 120a and 120b. In addition, in the present embodiment, the first inclined portion 120a and the second inclined portion 120b may have inclination angles gentle enough not to cause cracks in an inorganic layer and/or a wiring that may be located on or over the first and second inclined portions 120a and 120b.

Referring to the comparative example of FIG. 4, a dam 120' includes a first inclined portion 120'a and a second inclined portion 120'b that have the same shape, regardless of materials located under the dam 120'.

The dam 120' may include a first layer 121' and a second layer 123', and the second layer 123' may cover both a top surface and a side surface of the first layer 121'. Since the second layer 123' is located on the first layer 121', the dam 120' may have a relatively greater height, and the first and second inclined portions 120'a and 120'b have relatively sharper inclination angles compared to the dam 120 of FIG. 3. An inorganic layer and a wiring may be located on or over the dam 120'. If an inorganic layer and a wiring are located on the dam 120', the risk of cracks may be high due to its height and sharp inclination angles.

The conductive layer 20 is located under a first portion A1' that includes the first inclined portion 120'a, and the interlayer insulating layer 115 is located under a second portion A2' that includes the second inclined portion 120'b. If a shape of the first inclined portion 120'a and a shape of the second inclined portion 120'b are the same, as shown in FIG. 4, an adhesive force in the first portion A1' may be greater than an adhesive force in the second portion A2' because the adhesive force between the dam 120' and the conductive layer 20 is greater than the adhesive force between the dam 120' and the interlayer insulating layer 115.

Since the adhesive force in the second portion A2' is weak, peeling may occur at an interface between the second portion A2' and the interlayer insulating layer 115. The peeling may lead to defects of an inorganic layer and/or a wiring that may be formed in a subsequent process.

Referring back to FIG. 3, the display apparatus according to the present embodiment may include the dam 120 in the peripheral area PA, and shapes of the first inclined portion 120a and the second inclined portion 120b of the dam 120 may be different from each other.

The conductive layer 20 may be located under the first portion A1 of the dam 120 that includes the first inclined portion 120a, and thus an adhesive force between the conductive layer 20 and the dam 120 that is formed of an organic material may be strong. Accordingly, the first inclined portion 120a of the dam 120 in the first portion A1 may be made have a gentle inclination angle to prevent cracks from occurring in an inorganic layer and/or a wiring that may be located on or over the first portion A1. For example, a first angle $\theta_1$ of an end of the first inclined portion 120a with respect to a top surface of the substrate 110 or a top surface of the conductive layer 20 may be less than a second angle $\theta_2$ of an end of the second inclined portion 120b with respect to the top surface of the substrate 110 or a top surface of the interlayer insulating layer 115.

The second portion A2 of the dam 120 that includes the second inclined portion 120b contacts the interlayer insulating layer 115 that is located under the second portion A2. When the interlayer insulating layer 115 is formed of an inorganic material, an adhesive force between the interlayer insulating layer 115 and the dam 120 may be weak, and thus an adhesion-enhancing portion 120b2 may be formed on an edge of the second inclined portion 120b.

In the second inclined portion 120b of the dam 120, a recess portion 120b1 having a first height $h_1$ and the adhesion-enhancing portion 120b2 having a second height $h_2$ that is equal to or greater than the first height $h_1$ may be sequentially located away from the display area DA. The second inclined portion 120b may include the recess portion 120b1 at a middle portion. The recess portion 120b1 may correspond to a point at which an inclination angle of the second inclined portion 120b is changed. A height of the second inclined portion 120b may gradually decrease from a top surface of the dam 120 until reaching the recess portion 120b1, may gradually increase from the recess portion 120b1 until reaching a top surface of the adhesion-enhancing portion 120b2, and may gradually decrease from the adhesion-enhancing portion 120b2 until reaching an end of the second inclined portion 120b. The term 'height' used herein refers to a height from a top surface of a layer located under the dam 120, that is, a top surface of the interlayer insulating layer 115.

A distance d1 measured between a central line CL that passes through a central point of the top surface of the dam 120 and perpendicular to the substrate 110 and the end of the first inclined portion 120a may be the same as or similar to a distance d2 measured between the central line CL and the end of the second inclined portion 120b. The central line CL may pass through the central point of the top surface of the dam 120 and perpendicular to the top surface of the substrate 110 in a cross-sectional view of the dam 120 taken along a line connecting the display area DA and the peripheral area PA.

Accordingly, the second angle $\theta_2$ of the end of the second inclined portion 120b with respect to the top surface of the substrate 110 or the top surface of the interlayer insulating layer 115 may be greater than the first angle $\theta_1$ of the end of the first inclined portion 120a with respect to the top surface of the substrate 110 or the top surface of the conductive layer 20.

Since the second inclined portion 120b of the dam 120 includes the adhesion-enhancing portion 120b2, an adhesive force between the second inclined portion 120b and the interlayer insulating layer 115 may be increased. In addition, since the second inclined portion 120b has a curved or stepped shape due to the recess portion 120b1, cracks may be prevented from occurring in an inorganic layer and/or a wiring that may be located on or over the second inclined portion 120b.

The dam 120 may include the first layer 121 and the second layer 123. The first layer 121 may cover a portion of the conductive layer 20. The second layer 123 may cover both a top surface and a side surface of the first layer 121. In this case, since an end of the second layer 123 directly contacts the conductive layer 20 and the interlayer insulating layer 115, a profile of the second layer 123 may correspond to a profile of the dam 120. Angles $\theta_a$ and $\theta_b$ of an inclined portion of the first layer 121 close to the display area DA and an inclined portion of the first layer 121 away from the display area DA with respect to top surfaces of the underlying layers may be the same. The angles $\theta_a$ and $\theta_b$ of the inclined portions of the first layer 121 with respect to the top surfaces of the underlying layers may be substantially the same as the second angle $\theta_2$ of the end of the second inclined portion 120b.

Figure 5:
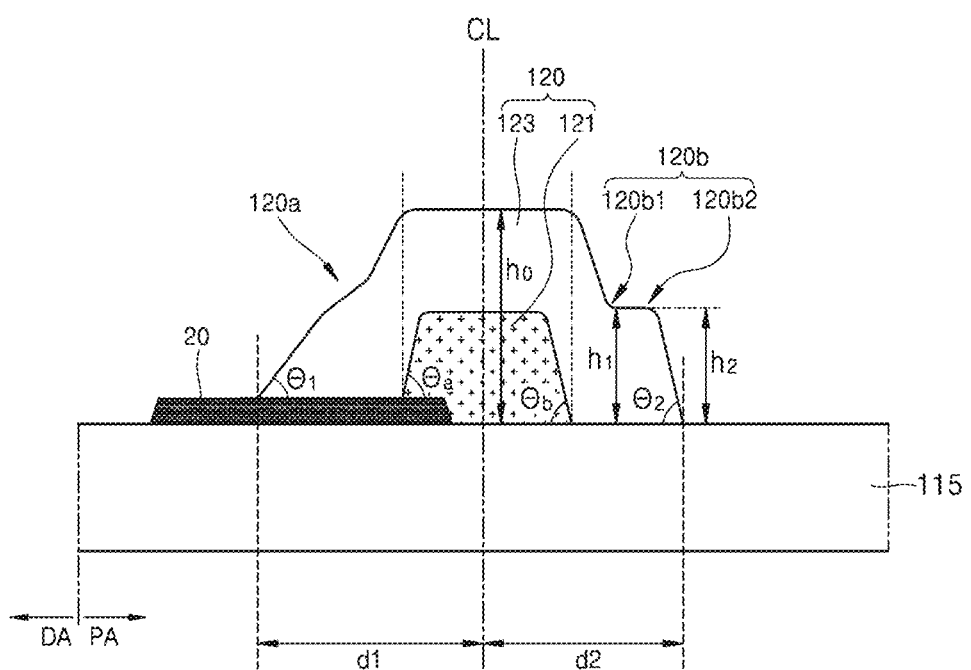
FIG. 5 is a cross-sectional view illustrating a portion of a display apparatus according to another embodiment.

FIG. 5 is a cross-sectional view illustrating a portion of a display apparatus according to another embodiment. In FIG. 5, the same elements as those in FIG. 3 are denoted by the same reference numerals, and thus repeated explanation thereof may be omitted.

Referring to FIG. 5, the display apparatus according to the present embodiment may include the dam 120 located in the peripheral area PA, and shapes of the first inclined portion 120a and the second inclined portion 120b of the dam 120 may be different from each other.

The dam 120 includes the first inclined portion 120a and the second inclined portion 120b. The first portion A1 including the first inclined portion 120a contacts the conductive layer 20, and the second portion A2 including the second inclined portion 120b contacts the interlayer insulating layer 115.

The first angle $\theta_1$ of an end of the first inclined portion 120a of the dam 120 with respect to a top surface of the substrate 110 or a top surface of the conductive layer 20 may be less than the second angle $\theta_2$ of an end of the second inclined portion 120b with respect to the top surface of the substrate 110 or a top surface of the interlayer insulating layer 115.

In the second inclined portion 120b of the dam 120, the recess portion 120b1 having the first height $h_1$ and the adhesion-enhancing portion 120b2 having the second height $h_2$ that is substantially equal to the first height $h_1$ may be sequentially located away from the display area DA. The second inclined portion 120b may include the recess portion 120b1 at a middle portion. The recess portion 120b1 may correspond to a point at which an inclination angle of the second inclined portion 120b is changed.

As described below, to form the recess portion 120b1 and the adhesion-enhancing portion 120b2 of the second inclined portion 120b, a half-tone mask pattern and a full-tone mask pattern may be used, and then a curing process may be performed. In this case, since a degree of reflow of an organic material may vary according to a condition of the curing process, in some embodiments, the height $h_1$ of the recess portion 120b1 and the height $h_2$ of the adhesion-enhancing portion 120b2 may be formed to be substantially the same. However, even in this case, the first angle $\theta_1$ and the second angle $\theta_2$ may be different from each other to some extent.

In the present embodiment, a height of the second inclined portion 120b may gradually decrease from a top surface of the dam 120 until reaching the recess portion 120b1, may be substantially constant from the recess portion 120b1 until reaching a top surface of the adhesion-enhancing portion 120b2, and may gradually decease from the adhesion-enhancing portion 120b2 until reaching an end of the second inclined portion 120b. The term 'height' used herein refers to a height from a top surface of a layer located under the dam 120, that is, a top surface of the interlayer insulating layer 115.

The distance d1 measured between the central line CL that passes through a central point of the top surface of the dam 120 and perpendicular to the substrate 110 and the end of the first inclined portion 120a may be the same as or similar to the distance d2 measured between the central line CL and the end of the second inclined portion 120b. The central line CL may pass through the central point of the top surface of the dam 120 and perpendicular to the top surface of the substrate 110 in a cross-sectional view of the dam 120 taken along a line connecting the display area DA and the peripheral area PA.

Accordingly, the second angle 02 of the end of the second inclined portion 120b with respect to the top surface of the substrate 110 or the top surface of the interlayer insulating layer 115 may be greater than the first angle $\theta_1$ of the end of the first inclined portion 120a with respect to the top surface of the substrate 110 or the top surface of the conductive layer 20.

Since the second inclined portion 120b of the dam 120 includes the adhesion-enhancing portion 120b2, an adhesive force between the second inclined portion 120b and the interlayer insulating layer 115 may be improved. In addition, since the second inclined portion 120b has a stepped shape due to the recess portion 120b1, cracks may be prevented from occurring in an inorganic layer and/or a wiring that may be located on or over the second inclined portion 120b.

The dam 120 may include the first layer 121 and the second layer 123. The first layer 121 may cover a portion of the conductive layer 20. The second layer 123 may cover both a top surface and a side surface of the first layer 121. In this case, since an end of the second layer 123 directly contacts the conductive layer 20 and the interlayer insulating layer 115, a profile of the second layer 123 may correspond to a profile of the dam 120. The angles $\theta_a$ and $\theta_b$ of an inclined portion of the first layer 121 close to the display area DA and an inclined portion of the first layer 121 away from the display area DA with respect to top surfaces of the underlying layers may be the same. The angles $\theta_a$ and $\theta_b$ of the inclined portions of the first layer 121 with respect to the top surfaces of the underlying layers may be substantially the same as the second angle $\theta_2$ of the second inclined portion 120b.

FIGS. 6A through 6D are plan views illustrating portions of masks for manufacturing a display apparatus according to various embodiments.

Referring to FIGS. 6A through 6D, masks M1, M2, M3, and M4 include a first mask pattern MP1 for forming the first inclined portion 120a (see FIG. 3) of the dam 120, a second mask pattern MP2 for forming a central portion of the dam 120, and a third mask pattern MP3 for forming the second inclined portion 120b.

The first mask pattern MP1 may be a half-tone mask pattern. The first mask pattern MP1 may overlap a portion of the conductive layer 20. The half-tone mask pattern may be a semi-light-transmitting portion and may partially transmit and partially shield light during an exposure process. The partially transmitted light through the first mask pattern MP1 may cure a photosensitive organic material of the dam 120 to form a gentle inclination angle.

The second mask pattern MP2 is located beside the first mask pattern MP1 away from the display area DA and may be used to form the central portion of the dam 120. The second mask pattern MP2 may shield or expose the central portion of the dam 120 during the exposure process according to the characteristics of the photosensitive organic material used to form the dam 120. When the dam 120 is formed of a positive photosensitive organic material, the second mask pattern MP2 may be a full-tone mask pattern. When the dam 120 is formed of a negative photosensitive organic material, the second mask pattern MP2 may be a light-transmitting portion.

The third mask pattern MP3 is located beside the second mask pattern MP2 away from the display area DA and may be used to form the second inclined portion 120b. The third mask pattern MP3 may be formed by alternately locating a first pattern and a second pattern that have different transmittances. For example, when the dam 120 is formed of a positive photosensitive organic material, the third mask pattern MP3 may be formed by alternately locating a half-tone mask pattern and a full-tone mask pattern. Accordingly, the amount of the photosensitive organic material remaining in an area corresponding to the third mask pattern MP3 is greater than the amount of the photosensitive organic material remaining in an area corresponding to the first mask pattern MP1. Accordingly, the second inclined portion 120b may have an inclination angle and/or a height greater than those/that of the first inclined portion 120a.

Figure 6A:
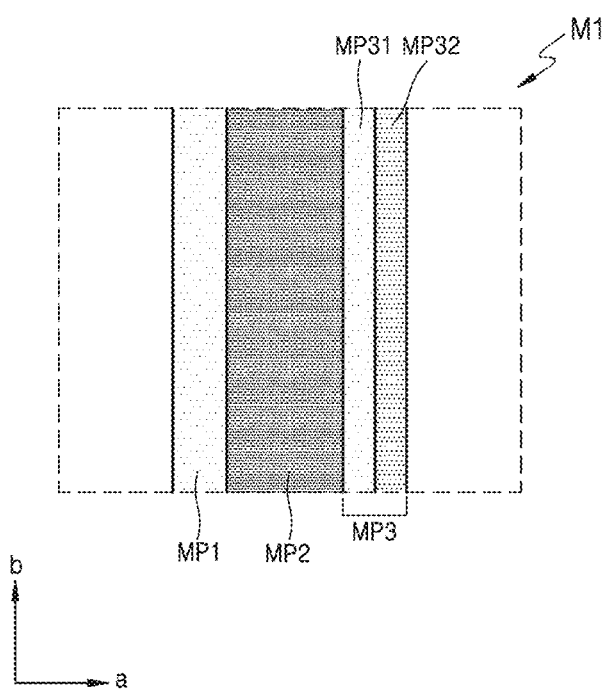
FIG. 6A is a plan view illustrating a portion of a mask according to an embodiment.

Referring to FIG. 6A, the third mask pattern MP3 includes a first pattern MP31 and a second pattern MP32 that are sequentially located in a direction 'a' from the second mask pattern MP2. The first pattern MP31 may be a half-tone mask pattern, and the second pattern MP32 may be a full-tone mask pattern. Although widths of the first pattern MP31 and the second pattern MP32 are shown to be the same in FIG. 6A, the present disclosure is not limited thereto. A width of the second pattern MP32 may vary to increase an adhesive force between the materials of the underlying layers. In some embodiments, a width of the second pattern MP32 may range from about 2 μm to about 10 μm. In some embodiments, a width of the first pattern MP31 may range from about 5 μm to about 13 μm.

Figure 6B:
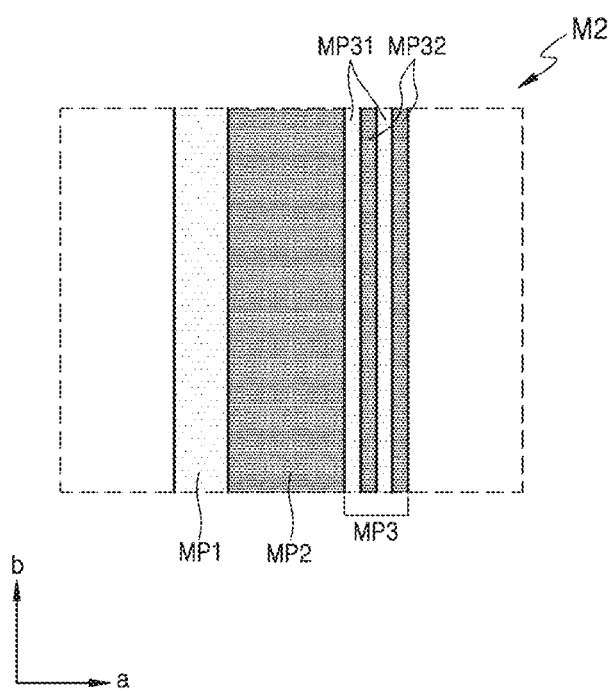
FIG. 6B is a plan view illustrating a portion of a mask according to another embodiment.

Referring to FIG. 6B, the third mask pattern MP3 includes the first pattern MP31, the second pattern MP32, the first pattern MP31, and the second pattern MP32 that are sequentially located in the direction 'a' from the second mask pattern MP2. The first pattern MP31 may be a half-tone mask pattern, and the second pattern MP32 may be a full-tone mask pattern.

Figure 6C:
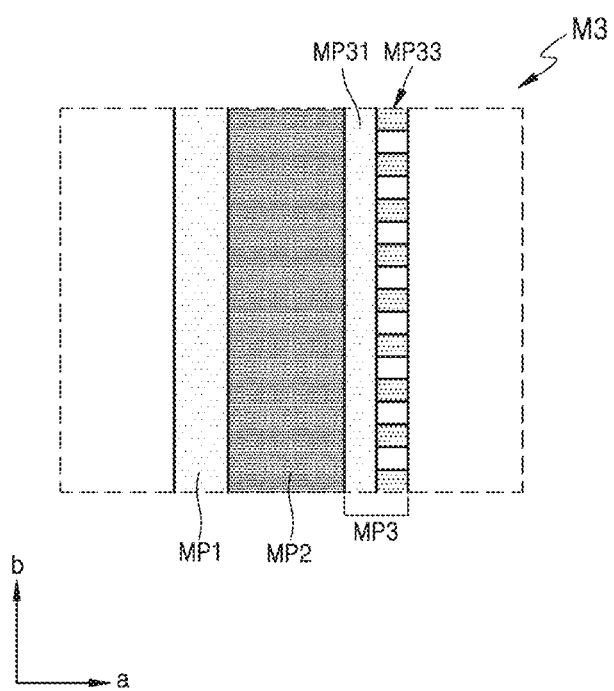
FIG. 6C is a plan view illustrating a portion of a mask according to another embodiment.

Referring to FIG. 6C, the third mask pattern MP3 includes the first pattern MP31 and a third pattern MP33 that are located in the direction 'a' from the second mask pattern MP2. The first pattern MP31 may be a half-tone mask pattern. The third pattern MP33 may include a plurality of half-tone mask patterns and a plurality of full-tone mask patterns that are alternately located in a direction 'b' that intersects the direction 'a'.

Figure 6D:
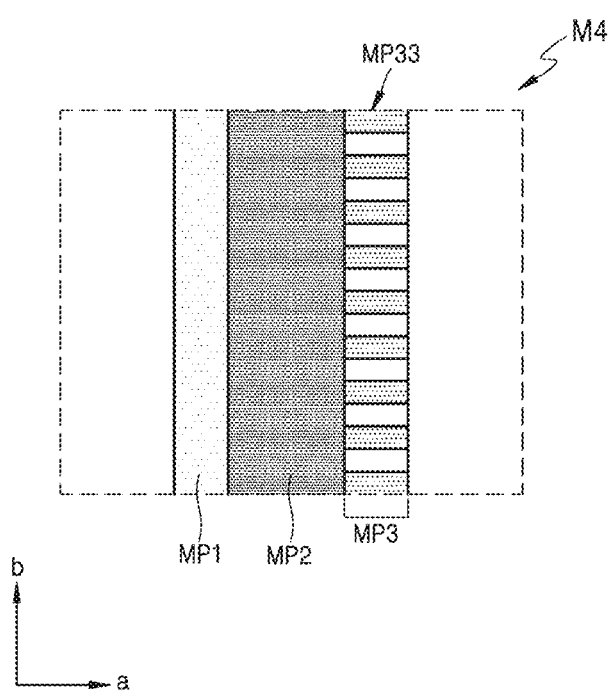
FIG. 6D is a plan view illustrating a portion of a mask according to another embodiment.

Referring to FIG. 6D, the third mask pattern MP3 includes the third pattern MP33 that is provided in the direction 'a' from the second mask pattern MP2. The third pattern MP33 may include a plurality of half-tone mask patterns and a plurality of full-tone mask patterns that are alternately located in the direction 'b' that intersects the direction 'a'.

Figure 7A:
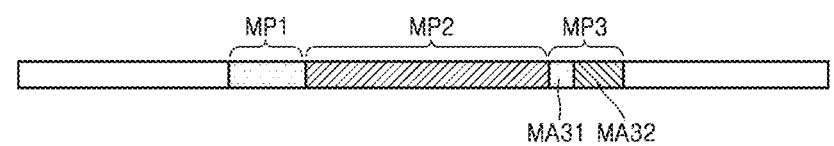
FIGS. 7A and 7B are cross-sectional views for describing a method of manufacturing a display apparatus according to the embodiment of FIG. 3.
Figure 7A:
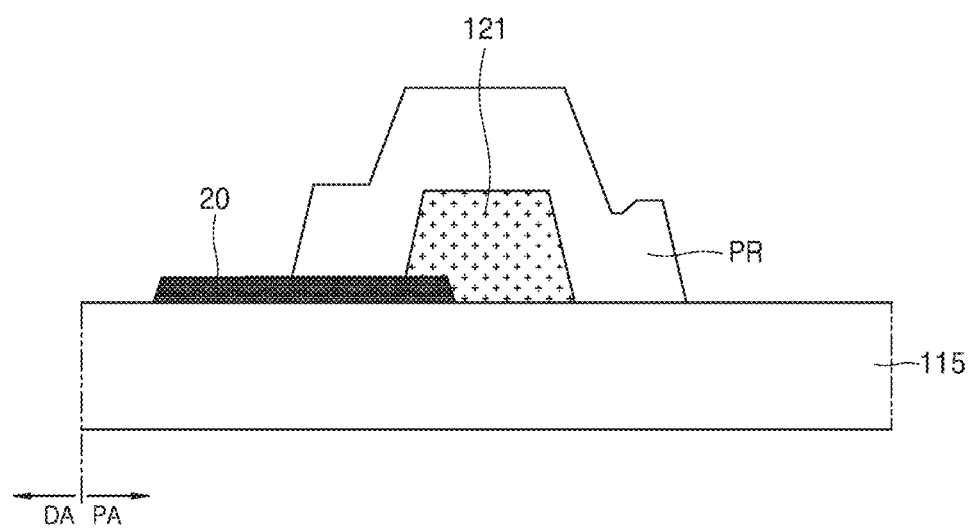
Figure 7B:
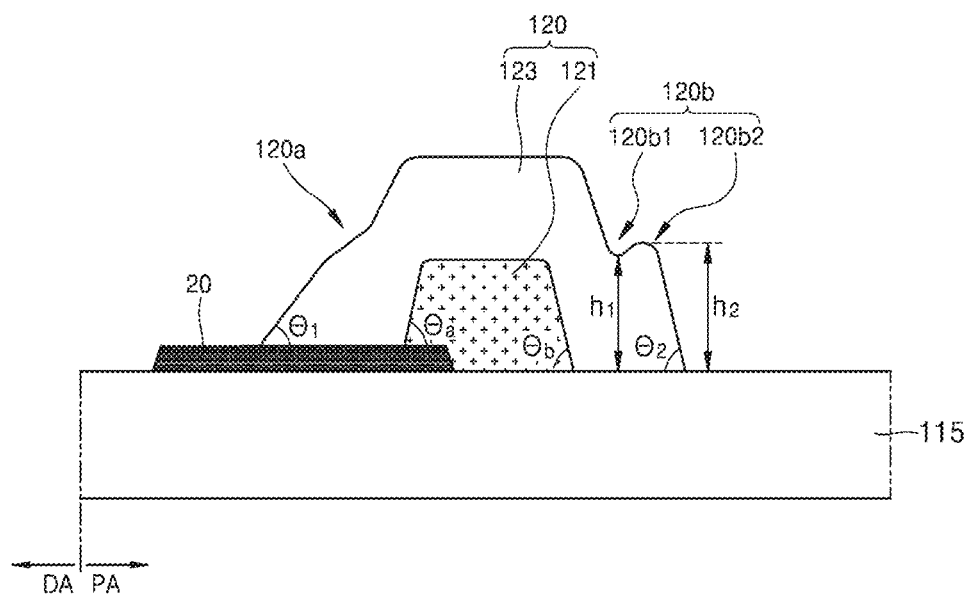
Figure 7C:
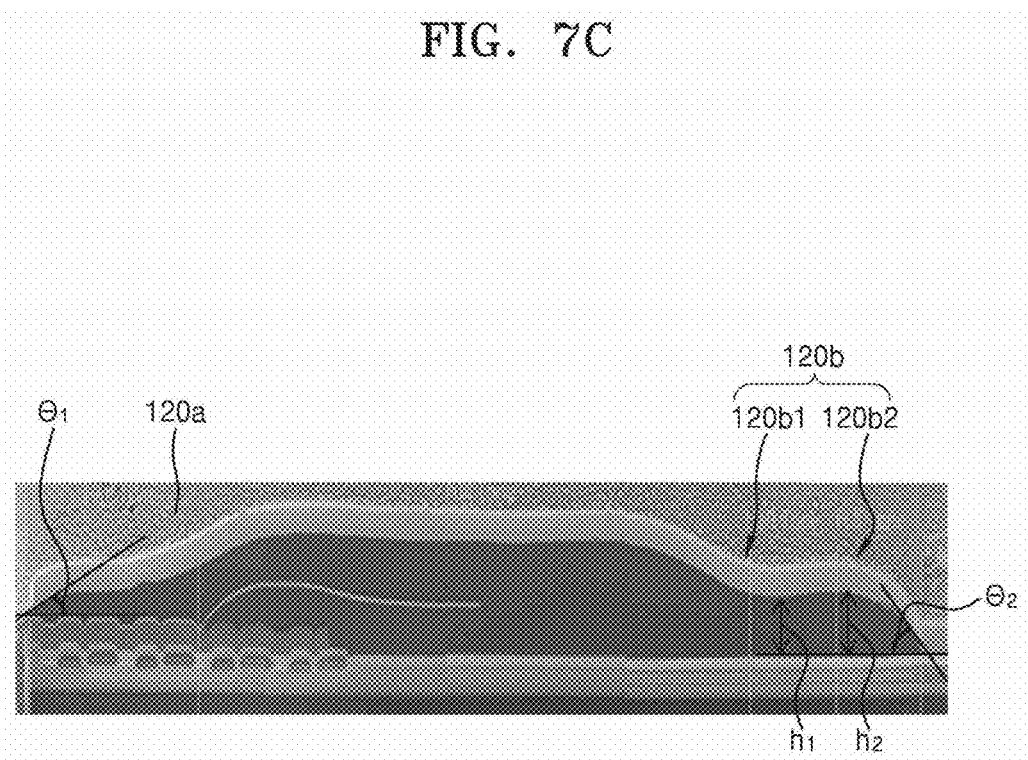
FIG. 7C is an image illustrating a portion of the display apparatus manufactured by using the method of FIGS. 7A and 7B.

FIGS. 7A and 7B are cross-sectional views for describing a method of manufacturing a display apparatus according to the embodiment of FIG. 3. FIG. 7C is an image illustrating a portion of the display apparatus manufactured by using the method of FIGS. 7A and 7B.

Referring to FIG. 7A, a photosensitive organic material PR is patterned by using the mask M1 of FIG. 6A.

First, the first layer 121 of the dam 120 is formed on the interlayer insulating layer 115 to cover an edge of the conductive layer 20.

Next, after the photosensitive organic material PR is applied to the interlayer insulating layer 115 to cover the first layer 121, exposure and development processes are performed by using the mask M1. In one embodiment, the photosensitive organic material PR may be a positive photosensitive organic material. The amount of the photosensitive organic material that remains may vary according to the amount of light exposed to the photosensitive organic material during the exposure process. That is, the amount of the photosensitive organic material PR remaining in an area corresponding to the first mask pattern MP1 and the first pattern MP31 of the third mask pattern MP3 may be less than the amount of the photosensitive organic material PR remaining in an area corresponding to the second mask pattern MP2 and the second pattern MP32 of the third mask pattern MP3.

Referring to FIG. 7B, the patterned photosensitive organic material PR is cured through a curing process. The curing process may be performed by applying heat for a predetermined period of time. While the curing process is performed, the photosensitive organic material PR may reflow. Due to the reflow of the photosensitive organic material PR, a shape of the second layer 123 of the dam 120 may be changed, and an extent of change may depend on the amount of the remaining photosensitive organic material PR. For example, the first angle $\theta_1$ of the first inclined portion 120a may be less than the second angle $\theta_2$ of the second inclined portion 120b.

FIG. 7C is an image illustrating a portion of the display apparatus manufactured by using the method of FIGS. 7A and 7B. In detail, FIG. 7C is an enlarged image illustrating the dam 120.

Referring to FIG. 7C, the dam 120 includes the first inclined portion 120a and the second inclined portion 120b. The first angle $\theta_1$ of the first inclined portion 120a is less than the second angle $\theta_2$ of the second inclined portion 120b. In addition, the dam 120 includes the recess portion 120b1 and the adhesion-enhancing portion 120b2 that is located outside the recess portion 120b1. The second height $h_2$ of the adhesion enhancing portion 120b2 is greater than the first height $h_1$ of the recess portion 120b1. This structure may increase an adhesive force even when an inorganic insulating layer is located under the dam 120, and may prevent cracks from occurring in an inorganic layer and/or a wiring that may be located on or over the dam 120.

Figure 8:
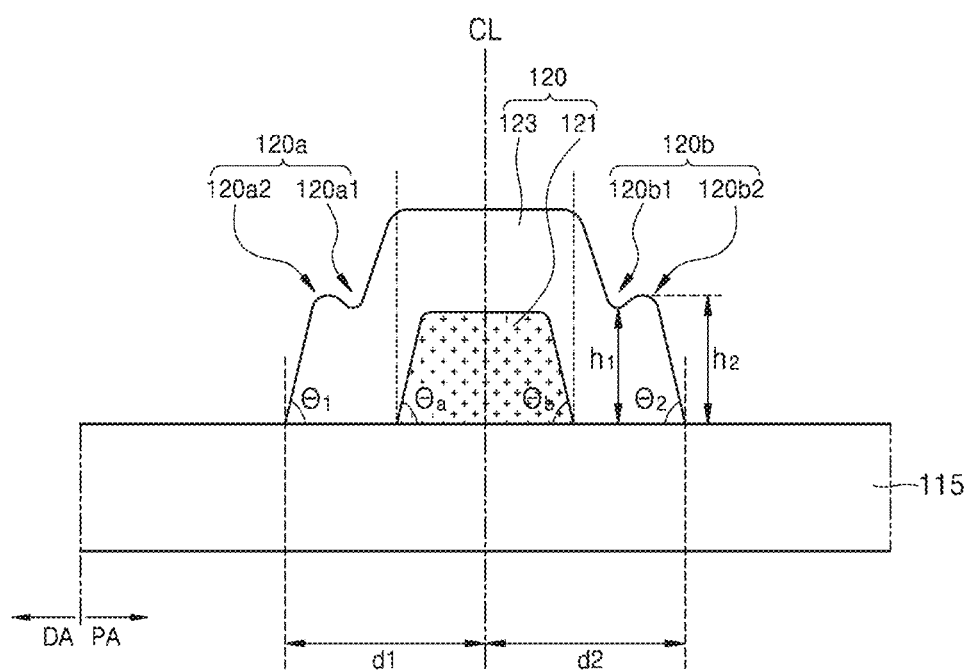
FIG. 8 is a cross-sectional view illustrating a portion of a display apparatus according to another embodiment.

FIG. 8 is a cross-sectional view illustrating a portion of a display apparatus according to another embodiment. In FIG. 8, the same elements as those in FIG. 3 are denoted by the same reference numerals, and thus repeated explanation thereof may be omitted.

Referring to FIG. 8, the display apparatus according to the present embodiment may include the dam 120 located in the peripheral area PA, and the dam 120 may not contact the conductive layer 20. For example, only the interlayer insulating layer 115 formed of an inorganic material may be located under the dam 120. In this case, shapes of the first inclined portion 120a and the second inclined portion 120b of the dam 120 may be mirror images of each other.

The first inclined portion 120a and the second inclined portion 120b of the dam 120 may include recess portions 120a1 and 120b1, and adhesion-enhancing portions 120a2 and 120b2 that are located outside the recess portions 120a1 and 120b1. The adhesion-enhancing portions 120a2 and 120b2 have heights $h_2$ that are equal to or greater than the heights $h_1$ of the recess portions 120a1 and 120b1.

The dam 120 may include the first layer 121 and the second layer 123. The first layer 121 may cover a portion of the interlayer insulating layer 115. The second layer 123 may cover both a top surface and a side surface of the first layer 121. In this case, since an end of the second layer 123 directly contacts the interlayer insulating layer 115, a profile of the second layer 123 may correspond to a profile of the dam 120.

Since the dam 120 has a curved or stepped portion due to the recess portions 120a1 and 120b1, cracks may be prevented from occurring in an inorganic layer and/or a wiring that may be located on or over the dam 120. Since the adhesion-enhancing portions 120a2 and 120b2 are located outside the recess portions 120a1 and 120b1, an adhesive force between the dam 120 and the interlayer insulating layer 115 that is formed of an inorganic material and located under the dam 120 may be increased.

Figure 9:
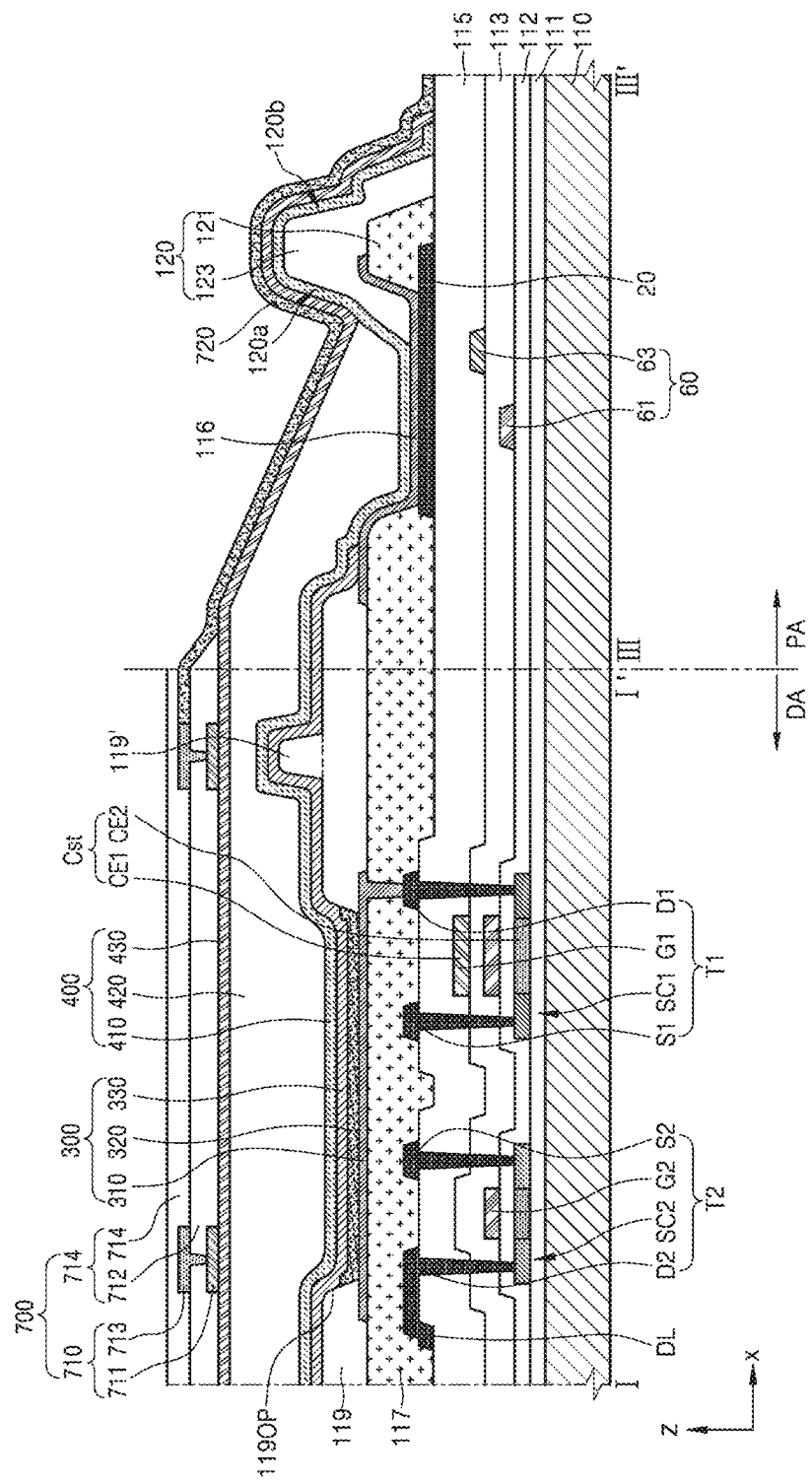
FIG. 9 is a cross-sectional view illustrating a portion of a display apparatus according to another embodiment.

FIG. 9 is a cross-sectional view illustrating a portion of a display apparatus according to another embodiment. In FIG. 9, the same elements as those in FIG. 2 are denoted by the same reference numerals, and thus repeated explanation thereof may be omitted.

Referring to FIG. 9, the display apparatus according to an embodiment may include the dam 120 located in the peripheral area PA, and shapes of the first inclined portion 120a and the second inclined portion 120b of the dam 120 may vary according to materials located under the dam 120.

In the present embodiment, an end of the first inclined portion 120a may contact the conductive layer 20, and an end of the second inclined portion 120b may contact the interlayer insulating layer 115. In this case, the first angle $\theta_1$ of the end of the first inclined portion 120a with respect to a top surface of the conductive layer 20 may be less than the second angle $\theta_2$ of the end of the second inclined portion 120b with respect to a top surface of the interlayer insulating layer 115.

The second inclined portion 120b may include the recess portion 120b1 and the adhesion-enhancing portion 120b2 that is located outside the recess portion 120b1 and has a height equal to or greater than a height of the recess portion 120b1. Accordingly, an adhesive force with the interlayer insulating layer 115 that is formed of an inorganic insulating layer may be increased.

In the present embodiment, the display apparatus may further include a touchscreen layer 700 located on the thin-film encapsulation layer 400. A cover layer (not shown) that protects the touchscreen layer 700 may be located on the touchscreen layer 700.

When mutual capacitance between touch electrodes 710 of the touchscreen layer 700 is changed when a cover layer (not shown) is touched, the touchscreen layer 700 may detect the change of the mutual capacitance by using, for example, a capacitive sensing method, and may determine a touch location. Alternatively, the touchscreen layer 700 may detect the change of the mutual capacitance and may determine a touch location by using any of various other sensing methods.

The touchscreen layer 700 according to an embodiment may have a structure in which a first touch conductive layer 711, a first insulating layer 712, a second touch conductive layer 713, and a second insulating layer 714 are sequentially stacked. The touch electrode 710 may include the first touch conductive layer 711 and the second touch conductive layer 713.

In some embodiments, the second touch conductive layer 713 may serve as a sensor for detecting a position of a touch input, and the first touch conductive layer 711 may serve as a connector for connecting the second touch conductive layer 713 in one direction.

In some embodiments, both the first touch conductive layer 711 and the second touch conductive layer 713 may serve as sensors. For example, the first insulating layer 712 may include a via hole that exposes a top surface of the first touch conductive layer 711, and the first touch conductive layer 711 and the second touch conductive layer 713 may be connected to each other through the via hole. Since the first touch conductive layer 711 and the second touch conductive layer 713 are connected to each other, a resistance of the touch electrode 710 may be reduced, and a response speed of the touchscreen layer 700 may be improved.

In some embodiments, the touch electrode 710 may have a mesh structure through which light emitted from the organic light-emitting device 300 may pass. In this case, the first touch conductive layer 711 and the second touch conductive layer 713 of the touch electrode 710 may be located not to overlap an emission area of the organic light-emitting device 300.

Each of the first touch conductive layer 711 and the second touch conductive layer 713 may be a single or multi-layer film formed of a conductive material having high conductivity. For example, each of the first touch conductive layer 711 and the second touch conductive layer 713 may include a transparent conductive layer, Al, Cu, and/or Ti. The transparent conductive layer may include a transparent conductive oxide such as ITO, IZO, ZnO, and indium tin zinc oxide (ITZO). The transparent conductive layer may include a conductive polymer such as poly(3, 4-ethylenedioxythiophene) (PEDOT), metal nanowires, and graphene. In some embodiments, each of the first touch conductive layer 711 and the second touch conductive layer 713 may have a stacked structure including Ti/Al/Ti.

Each of the first insulating layer 712 and the second insulating layer 714 may be formed of an inorganic material or an organic material. The inorganic material may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. The organic material may include at least one of acrylic resin, methacrylic resin, polyisoprene, vinyl-based resin, epoxy-based resin, urethane-based resin, cellulose-based resin, and perylene-based resin.

Although not shown in FIG. 9, a touch buffer layer may be further provided between the thin-film encapsulation layer 400 and the touchscreen layer 700. The touch buffer layer may prevent a damage to the thin-film encapsulation layer 400, and may block an interference signal that may be generated when the touchscreen layer 700 operates. The touch buffer layer may include an inorganic material such as silicon oxide, silicon nitride, silicon oxynitride, aluminum oxide, aluminum nitride, titanium oxide, and titanium nitride, or an organic material such as PI, polyester, and acryl, and may have a structure in which multiple layers of the above materials are stacked.

The touch buffer layer and/or the touchscreen layer 700 may be directly formed on the thin-film encapsulation layer 400 by using a deposition process or the like. In this case, an adhesive layer may not be required to be formed on the thin-film encapsulation layer 400. Accordingly, a thickness of the display apparatus may be reduced.

A touch wiring 720 may be connected to the touch electrode 710, and may extend from the top of the thin-film encapsulation layer 400 along a side surface of the thin-film encapsulation layer 400 to the peripheral area PA. The touch wiring 720 may further extend along shapes of a side surface and a top surface of the dam 120. In some embodiments, the touch wiring 720 may cover the dam 120.

The touch wiring 720 may be simultaneously formed with the first touch conductive layer 711, the second touch conductive layer 713, or both by using the same material. The touch wiring 720 may be a single or multi-layer film formed of a conductive material including a transparent conductive layer, Al, Cu, and/or Ti.

In the present embodiment, since the first inclined portion 120a of the dam 120 has a gentle inclination angle and the second inclined portion 120b has a curved shape due to the recess portion 120b1, defects such as cracks and disconnection may be prevented from occurring in the touch wiring 720 that covers the dam 120.

Figure 10:
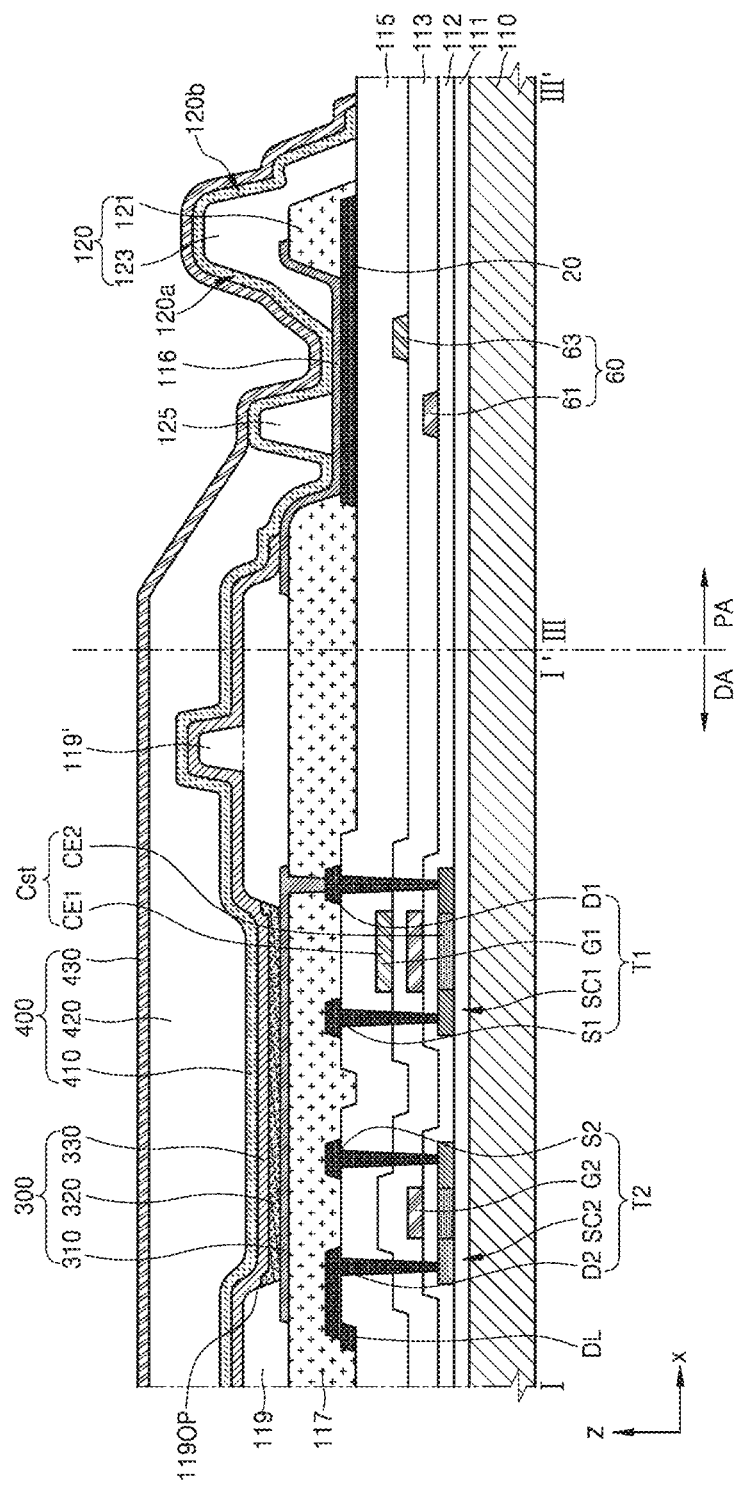
FIG. 10 is a cross-sectional view illustrating a portion of a display apparatus according to another embodiment.

FIG. 10 is a cross-sectional view illustrating a portion of a display apparatus according to another embodiment. In FIG. 10, the same elements as those in FIG. 2 are denoted by the same reference numerals, and thus repeated explanation thereof may be omitted.

Referring to FIG. 10, the display apparatus according to an embodiment may include the dam 120 located in the peripheral area PA, and shapes of the first inclined portion 120a and the second inclined portion 120b of the dam 120 may vary according to materials located under the dam 120.

In the present embodiment, an end of the first inclined portion 120a may contact the conductive layer 20, and an end of the second inclined portion 120b may contact the interlayer insulating layer 115. In this case, the first angle $\theta_1$ of the end of the first inclined portion 120a with respect to a top surface of the conductive layer 20 may be less than the second angle $\theta_2$ of the end of the second inclined portion 120b with respect to a top surface of the interlayer insulating layer 115.

The second inclined portion 120b may include the recess portion 120b1 and the adhesion-enhancing portion 120b2 that is located outside the recess portion 120b1 and has a height equal to or greater than a height of the recess portion 120b1. Accordingly, an adhesive force with the interlayer insulating layer 115 that is formed of an inorganic insulating layer may be increased.

In the present embodiment, the display apparatus may further include an inner dam 125. The inner dam 125 may be spaced apart from the dam 120 and may be located adjacent to the display area DA. The inner dam 125 and the pixel-defining film 119 and/or the spacer 119' may be simultaneously formed by using the same material. A height of the inner dam 125 may be less than a height of the dam 120. Both ends of the inner dam 125 may overlap the conductive layer 20. The connection conductive layer 116 may be located between the inner dam 125 and the conductive layer 20.

Although not shown in FIG. 10, an outer dam (not shown) may be further provided outside the dam 120. Since a plurality of dams such as the dam 120 and the inner dam 125 are provided, a flow of the organic encapsulation layer 420 may be more effectively blocked.

Figure 11:
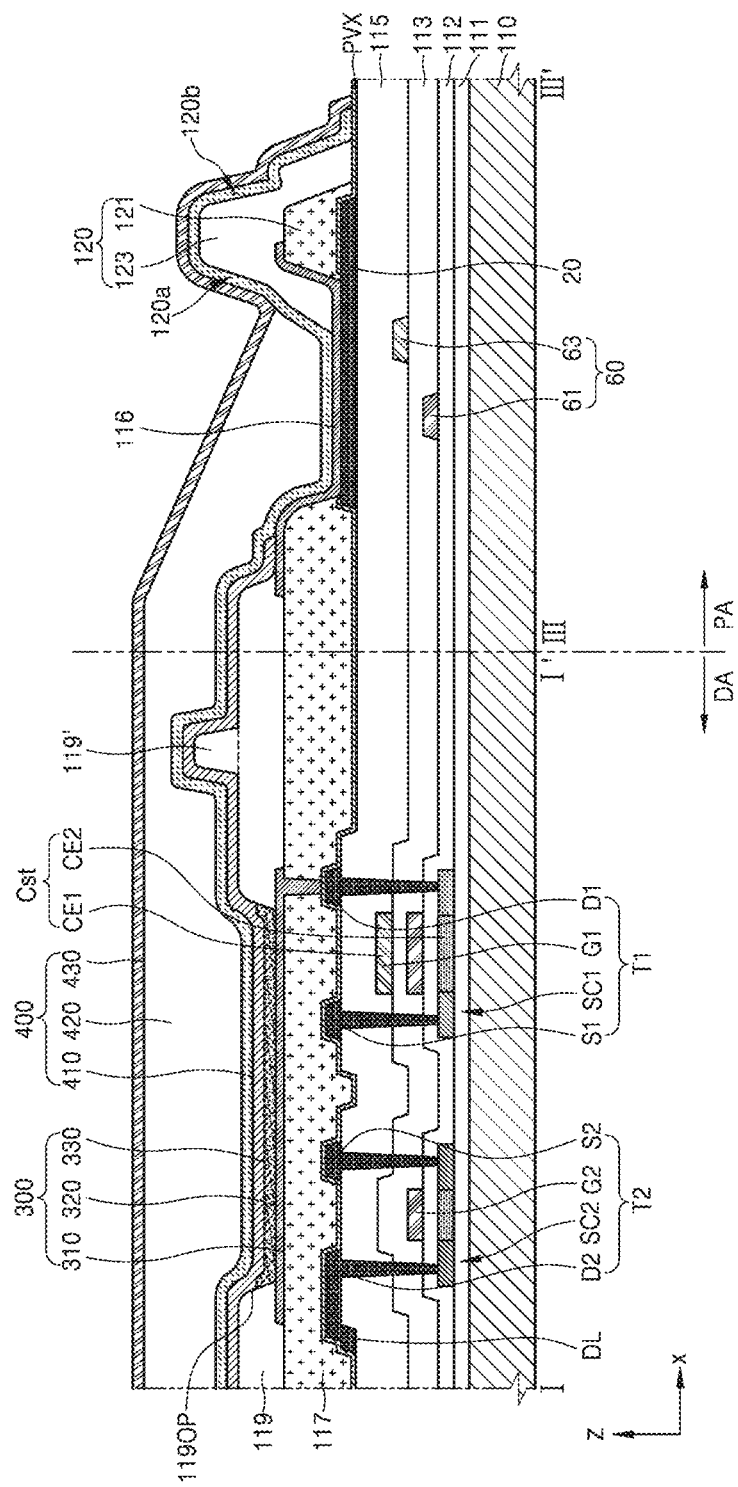
FIG. 11 is a cross-sectional view illustrating a portion of a display apparatus according to another embodiment.

FIG. 11 is a cross-sectional view illustrating a portion of a display apparatus according to another embodiment. In FIG. 11, the same elements as those in FIG. 2 are denoted by the same reference numerals, and thus repeated explanation thereof may be omitted.

Referring to FIG. 11, the display apparatus according to an embodiment may further include an inorganic protective layer PVX. The inorganic protective layer PVX may be provided on the interlayer insulating layer 115 to cover the data line DL, the source lines S1 and S2, and the drain electrodes D1 and D2.

The inorganic protective layer PVX may be a single or multi-layer film formed of silicon nitride (SiNx) and/or silicon oxide (SiOx). The inorganic protective layer PVX may cover and protect exposed wirings in the peripheral area PA. Portions of wirings and/or a conductive layer formed in the same process as the data line DL may be exposed in a portion (e.g., a portion of the peripheral area PA) of the substrate 110. The exposed portions of the wirings and/or the conductive layer may be damaged by an etchant that may be used when the pixel electrode 310 is patterned. Since the inorganic protective layer PVX covers the data line DL and at least some of the wirings that are simultaneously formed with the data line DL, the wirings and/or the conductive layer may be prevented from being damaged in a process of patterning the pixel electrode 310.

In the present embodiment, the inorganic protective layer PVX may expose a portion of the conductive layer 20. The conductive layer 20 may be used as a second power supply voltage line and may be connected to the counter electrode 330. In one embodiment, the counter electrode 330 may be connected to the conductive layer 20 through the connection conductive layer 116.

Figure 12:
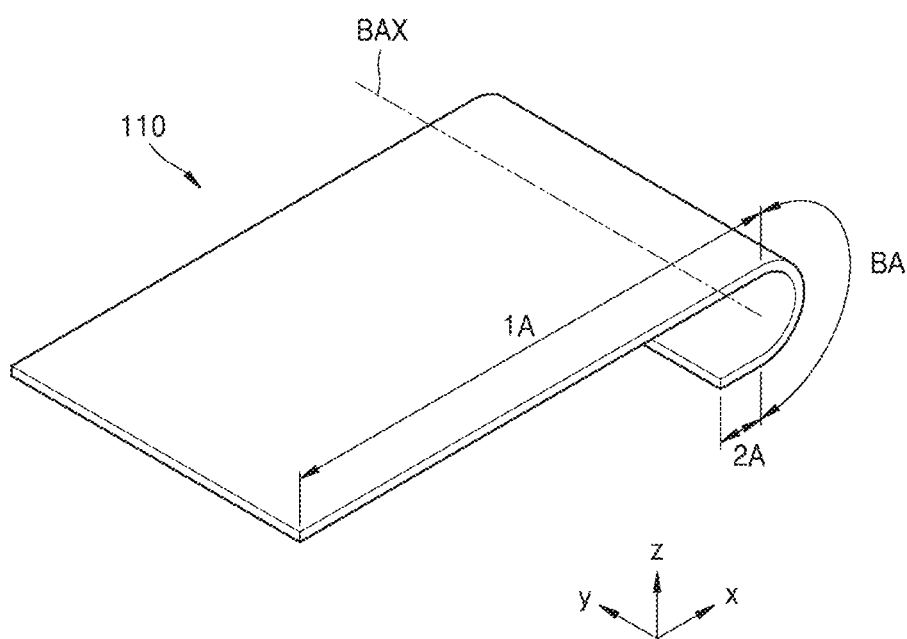
FIG. 12 is a perspective view illustrating a portion of a display apparatus according to one embodiment.
Figure 13:
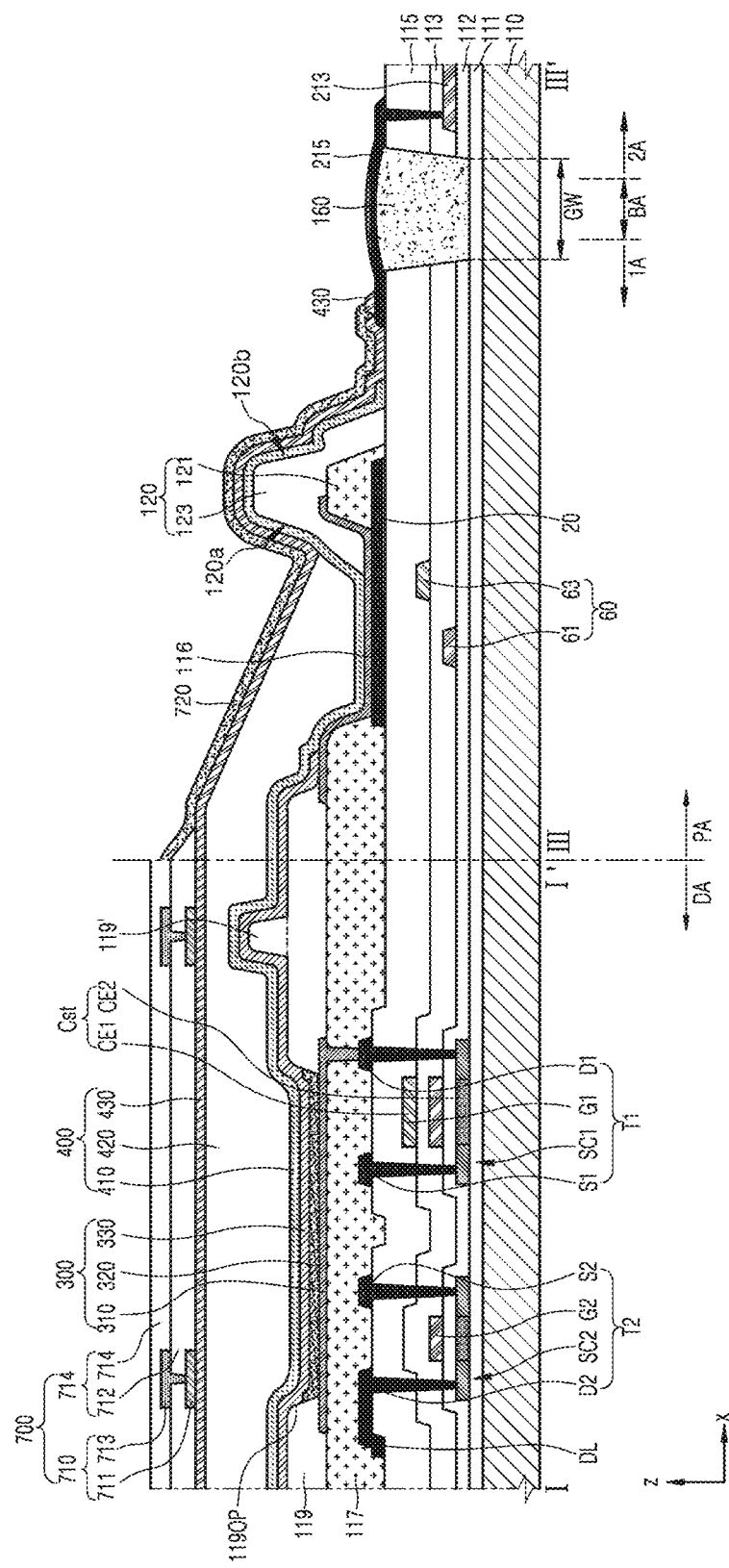
FIG. 13 is a cross-sectional view illustrating a portion of the display apparatus of FIG. 12.

FIG. 12 is a perspective view illustrating a portion of a display apparatus according to one embodiment. FIG. 13 is a cross-sectional view illustrating a portion of the display apparatus of FIG. 12. In FIG. 13, the same elements as those in FIG. 9 are denoted by the same reference numerals, and thus repeated explanation thereof may be omitted.

portion of the substrate 110 included in the display apparatus may be bent as shown in FIG. 12. As shown in FIG. 12, the substrate 110 has a bending area BA that extends in a first direction (e.g., a +y direction). The bending area BA is located between a first area 1A and a second area 2A in a second direction (e.g., a +x direction) that intersects the first direction. The substrate 110 may be bent about a bending axis BAX that extends in the first direction (e.g., the +y direction) as shown in FIG. 12.

Referring to FIG. 13, the buffer layer 111 may extend over the first area 1A, the bending area BA, and the second area 2A. Each of the first gate insulating layer 112, the second gate insulating layer 113, and the interlayer insulating layer 115 may have an opening corresponding to the bending area BA. The buffer layer 111, the first gate insulating layer 112, the second gate insulating layer 113, and the interlayer insulating layer 115 each including an inorganic material may be collectively referred to as an inorganic insulating layer. The inorganic insulating layer including the buffer layer 111, the first gate insulating layer 112, the second gate insulating layer 113, and the interlayer insulating layer 115 may include a groove corresponding to the bending area BA. The groove may include a top surface of the buffer layer 11 and the openings of the first gate insulating layer 112, the second gate insulating layer 113, and the interlayer insulating layer 115. The inorganic insulating layer may include a groove having any of various other shapes. For example, a portion of the top surface of the buffer layer 111 in a direction (e.g., a +z direction) may be removed, and a bottom surface of the first gate insulating layer 112 in a direction (e.g., a −z direction) may remain without being removed.

The groove may overlap the bending area BA. In this case, the area of the groove may be greater than the area of the bending area BA. In FIG. 13, a width GW of the groove may be greater than a width of the bending area BA.

The display apparatus according to the present embodiment includes an organic layer 160 filling at least a portion of the groove of the inorganic insulating layer. A connection wiring 215 may extend from the first area 1A through the bending area BA to the second area 2A, and may overlap the organic layer 160. The connection wiring 215 may further extend to overlap the inorganic insulating layer such as the interlayer insulating layer 115.

FIG. 13 show the display apparatus in a state prior to bending for convenience, and the display apparatus according to the present embodiment may be in a state where the substrate 110, etc. are actually bent in the bending area BA as shown in FIG. 12. The display apparatus may be initially manufactured in a state where the substrate 110 is substantially flat as shown in FIG. 13 and may be subsequently bent by bending the substrate 110, etc. in the bending area BA. In this case, when the substrate 110, etc. are bent, tensile stress may be applied to the connection wiring 215. The groove of the inorganic insulating layer and the organic layer 160 may prevent or reduce defects from occurring in the connection wiring 215 during a bending process.

The connection wiring 215 may be formed of the same material as that of the data line DL, the source electrodes S1 and S2, and the drain electrodes D1 and D2. In some embodiments, the connection wiring 215 may be connected to the touch wiring 720 in the first area 1A, and may serve as a wiring for transmitting/receiving an electrical signal to/from the touchscreen layer 700. The connection wiring 215 may be connected in the second area 2A to a lower wiring 213 located on a different layer through a contact hole. The lower wiring 213 may be connected to the pad unit 50 and may transmit/receive an electrical signal to/from the connection wiring 215.

Since the touch wiring 720 is located on the thin-film encapsulation layer 400, the touch wiring 720 may be connected to the connection wiring 215 through a contact hole that may be formed in an end of the thin-film encapsulation layer 400.

As described above, a display apparatus according to the one or more embodiments includes a dam having a gentle inclination angle and a profile to increase an adhesive force between a conductive layer and an inorganic insulating layer, thereby ensuring high reliability.

It is noted that one or more effects described here do not limit the scope of the present disclosure.

While one or more embodiments of the present disclosure have been described with reference to the figures, it will be understood by one of ordinary skill in the art that various changes in form and details may be made therein without departing from the spirit and scope of the present disclosure as defined by the following claims.

What is claimed is:

1. A display apparatus comprising:
a substrate comprising a display area displaying an image and a peripheral area located around the display area;
a display device located in the display area;
a thin-film encapsulation layer covering the display device and comprising at least one inorganic film and at least one organic film;
a conductive layer located in the peripheral area and surrounding at least a portion of the display area; and
a dam at least partially overlapping an outer edge of the conductive layer,
wherein the dam comprises a center portion, a first inclined portion connected to the center portion and extending from about a top surface of the center portion toward the substrate in a thickness direction of the display apparatus and extending toward the display area in a plan view and at least partially overlapping the conductive layer and a second inclined portion connected to the center portion and extending from about the top surface of the center portion in an opposite direction to the first inclined portion in the plan view,
wherein a shape of the first inclined portion and a shape of the second inclined portion are different from each other,
wherein the first inclined portion meets a surface of the conductive layer at a first angle with respect to the thickness direction and the second inclined portion meets a surface of a layer beneath the second inclined portion at a second angle with respect to the thickness direction;
wherein the first angle and the second angle are with respect to a top surface of the substrate,
wherein the first angle is different than the second angle,
wherein the second inclined portion comprises a recess portion and an adhesion-enhancing portion,
wherein the recess portion is disposed between the center portion and the adhesion-enhancing portion, and the adhesion-enhancing portion is located outside the recess portion from the display area, and
wherein the recess portion has a bottommost portion that has a first height in the thickness direction of the display apparatus that is greater than zero and less than a height of the center portion, and the adhesion-enhancing portion has a second height in the thickness direction of the display apparatus that is equal to or greater than the first height and less than the height of the center portion.

2. The display apparatus of claim 1, wherein the dam has a stacked structure including a first layer and a second layer that covers a top surface and a side surface of the first layer, the first layer meets a surface below the first layer at first and second angles of the first layer with respect to the thickness direction, and the first angle of the first inclined portion is gentler than each of the first and second angles of the first layer.

3. The display apparatus of claim 1, further comprising:
a touchscreen layer located on the thin-film encapsulation layer; and
a touch wiring connected to the touchscreen layer and extending to the peripheral area,
wherein the touch wiring covers the dam.

4. The display apparatus of claim 1, further comprising an inner dam located between the display area and the dam,
wherein the inner dam has a first height less than a second height of the dam.

5. The display apparatus of claim 1, further comprising:
an inorganic insulating layer located in the peripheral area and having an opening or a groove; and
an organic layer filling at least a portion of the opening or the groove, wherein the substrate has a bending area located between a first area and a second area and is bent about a bending axis, and wherein the opening or the groove overlaps the bending area.

6. The display apparatus of claim 5, further comprising:

a touchscreen layer located on the thin-film encapsulation layer in the display area;

a touch wiring extending from the touchscreen layer to an outer edge of the dam; and a connection wiring connected to the touch wiring and located on the organic layer.

7. The display apparatus of claim 1, further comprising:

a thin-film transistor located in the display area and comprising a semiconductor layer, a source electrode, a drain electrode, and a gate electrode;

wherein the display device comprises a pixel electrode, an intermediate layer, and a counter electrode, wherein the conductive layer is located on a same layer as the source electrode or the drain electrode and is electrically connected to the counter electrode.

8. The display apparatus of claim 7, further comprising a connection conductive layer located between the conductive layer and the counter electrode, wherein the connection conductive layer is formed of a same material as a material of the pixel electrode.

9. The display apparatus of claim 8, wherein the dam partially contacts the connection conductive layer.

10. The display apparatus of claim 7, further comprising a fan-out wiring located in the peripheral area on a same layer as the gate electrode, wherein the fan-out wiring partially overlaps the conductive layer.

11. The display apparatus of claim 1, wherein the shape of the first inclined portion and the shape of the second inclined portion are asymmetric to each other about a line that divides the first inclined portion and the second inclined portion and passes through the top surface of the dam and is perpendicular to the top surface of the substrate.

12. A display apparatus comprising:

a substrate comprising a display area displaying an image and a peripheral area located around the display area;

a display device located in the display area;

a thin-film encapsulation layer covering the display device and comprising at least one inorganic film and at least one organic film; and a dam located in the peripheral area and surrounding at least a portion of the display area, wherein the dam comprises a center portion, a first inclined portion connected to the center portion and extending from about a top surface of the center portion toward the substrate in a thickness direction of the display apparatus and extending toward the display area in a plan view and a second inclined portion connected to the center portion and extending from about the top surface of the center portion in an opposite direction to the first inclined portion in the plan view, wherein the first inclined portion has a first angle with respect to a top surface of the substrate, and the second inclined portion has a second angle with respect to the top surface of the substrate, wherein the first angle is different than the second angle;

wherein the second inclined portion comprises a recess portion and an adhesion-enhancing portion, wherein the recess portion is disposed between the center portion and the adhesion-enhancing portion, and the adhesion-enhancing portion is located outside the recess portion from the display area, and wherein the recess portion has a bottommost portion that has a first height in the thickness direction of the display apparatus that is greater than zero and less than a height of the center portion, and the adhesion-enhancing portion has a second height in the thickness direction of the display apparatus that is equal to or greater than the first height and less than the height of the center portion.

13. The display apparatus of claim 12, further comprising an interlayer insulating layer located between the substrate and the dam and comprising an inorganic material, wherein an end of the first inclined portion and an end of the second inclined portion contact the interlayer insulating layer, and a shape of the first inclined portion is a minor image of a shape of the second inclined portion.

* * * * *